(12) United States Patent
Murakami et al.

(10) Patent No.: US 8,423,871 B2
(45) Date of Patent: Apr. 16, 2013

(54) TRANSMITTING DEVICE AND TRANSMITTING METHOD

(75) Inventors: Yutaka Murakami, Osaka (JP); Shutai Okamura, Osaka (JP); Masayuki Orihashi, Kanagawa (JP)

(73) Assignee: Panasonic Corporation, Osaka (JP)

( * ) Notice: Subject to any disclaimer, the term of this patent is extended or adjusted under 35 U.S.C. 154(b) by 485 days.

(21) Appl. No.: 12/668,829

(22) PCT Filed: Jul. 11, 2008

(86) PCT No.: PCT/JP2008/001875
§ 371 (c)(1),
(2), (4) Date: Jan. 12, 2010

(87) PCT Pub. No.: WO2009/011116
PCT Pub. Date: Jan. 22, 2009

(65) Prior Publication Data
US 2010/0192047 A1 Jul. 29, 2010

(30) Foreign Application Priority Data

Jul. 13, 2007 (JP) ................................ 2007-184540
Jul. 11, 2008 (JP) ................................ 2008-181616

(51) Int. Cl.
*H03M 13/00* (2006.01)
*H04B 7/10* (2006.01)

(52) U.S. Cl.
USPC ............ 714/776; 714/758; 714/804; 375/347

(58) Field of Classification Search ........................ None
See application file for complete search history.

(56) References Cited

U.S. PATENT DOCUMENTS

| | | | | |
|---|---|---|---|---|
| 3,542,756 | A * | 11/1970 | Gallager | 714/762 |
| 6,014,411 | A * | 1/2000 | Wang | 375/259 |
| 6,539,367 | B1 * | 3/2003 | Blanksby et al. | 706/14 |
| 6,769,091 | B2 * | 7/2004 | Classon et al. | 714/792 |
| 6,903,665 | B2 * | 6/2005 | Akhter et al. | 341/50 |
| 7,519,898 | B2 * | 4/2009 | Narayanan et al. | 714/801 |
| 2003/0014718 | A1 * | 1/2003 | De Souza et al. | 714/804 |

(Continued)

FOREIGN PATENT DOCUMENTS

JP     2008-228285     9/2008

OTHER PUBLICATIONS

International Search Report dated Oct. 7, 2008.

(Continued)

*Primary Examiner* — Cynthia Britt
*Assistant Examiner* — Daniel McMahon
(74) *Attorney, Agent, or Firm* — Dickinson Wright PLLC

(57) ABSTRACT

A transmitting device and method enables improved reception quality on the receiving side when LDPC-CC (Low-Density Parity-Check Convolutional Codes) encoding is used. The transmitting device includes an LDPC-CC encoding section, a sorting section for sorting the encoded data acquired by the LDPC-CC encoding section into a first encoded data set corresponding to the column number of the column containing "1" in a part of an LDPC-CC check matrix H from which a protograph is excluded and a second encoded data set corresponding to the column numbers of the columns other than that, and a frame constructing section (control section) for constructing a transmission frame where the first and second encoded data sets are arranged in positions different in time or frequency in the transmission frame.

7 Claims, 33 Drawing Sheets

U.S. PATENT DOCUMENTS

| | | | |
|---|---|---|---|
| 2005/0149840 A1* | 7/2005 | Lee et al. | 714/800 |
| 2006/0291571 A1* | 12/2006 | Divsalar et al. | 375/242 |
| 2007/0011568 A1* | 1/2007 | Hocevar | 714/758 |
| 2007/0143657 A1* | 6/2007 | Kanaoka et al. | 714/752 |
| 2009/0019333 A1* | 1/2009 | McEvoy et al. | 714/752 |
| 2010/0050044 A1* | 2/2010 | Kuri et al. | 714/752 |

OTHER PUBLICATIONS

G. Richter et al., "Irregular Low-Density Parity-check Convolutional Codes Based on Protographs," ISIT 2006, IEEE, Jul. 2006, pp. 1633-1637.

A. Felstrom et al., "Time-Varying Periodic Convolutional Codes With Low-Density Parity-Check Matrix," IEEE Transactions on Information Theory, vol. 45, No. 6, Sep. 1999, pp. 2181-2191.

B. Lu et al., "Performance Analysis and Design Optimization of LDPC-Coded MIMO OFDM Systems," IEEE Transactions on Signal Processing, vol. 52, No. 2, Feb. 2004, pp. 348-361.

B. Hochwald et al., "Achieving Near-Capacity on a Multiple-Antenna Channel," IEEE Transactions on Communications, vol. 51, No. 3, Mar. 2003, pp. 389-399.

S. Baro et al., "Iterative Detection of MIMO Transmission Using a List-Sequential (LISS) Detector," IEEE, 2003, pp. 2653-2657.

M. Shen et al., "Effect of Traffic Channel Configuration on the Orthogonal Frequency Division Multiple Access Downlink Performance," IEEE Transactions on Wireless Communications, vol. 4, No. 4, Jul. 2005, pp. 1901-1913.

T. Ohgane et al., "Applications of Space Division Multiplexing and Those Performance in a MIMO Channel," IEICE Transactions on Communications, vol. E88-B, No. 5, May 2005, pp. 1843-1851.

P. Vitthaladevuni et al, "BER Computation of $4/M$-QAM Hierarchical Constellations," IEEE Transactions on Broadcasting, vol. 47, No. 3, Sep. 2001, pp. 228-239.

J. Hagenauer, "Rate-Compatible Punctured Convolutional Codes (RCPC Codes) and their Applications," IEEE Transactions on Communications, vol. 36, No. 4, Apr. 1988, pp. 389-400.

* cited by examiner $$H^T_{[0,n]} = \begin{pmatrix} h_1^{(0)}(0) & h_1^{(1)}(1) & \cdots & h_1^{(M)}(M) & 0 & 0 & \cdots & 0 \\ h_2^{(0)}(0) & h_2^{(1)}(1) & \cdots & h_2^{(M)}(M) & 0 & 0 & \cdots & 0 \\ 0 & h_1^{(0)}(1) & \cdots & \vdots & h_1^{(M)}(M+1) & 0 & \cdots & \vdots \\ & h_2^{(0)}(1) & \cdots & \vdots & h_2^{(M)}(M+1) & 0 & \cdots & h_1^{(M)}(n) \\ & 0 & \cdots & \vdots & \cdots & \ddots & \cdots & h_2^{(M)}(n) \\ & & \ddots & \vdots & & & & \vdots \\ & & & & & & & h_2^{(0)}(n) \\ & & & & & & & 0 \end{pmatrix}$$

TRANSMITTING DEVICE AND TRANSMITTING METHOD

TECHNICAL FIELD

The present invention relates to a transmitting apparatus and transmitting method for performing error correction coding of a signal sequence using an LDPC-CC (Low-Density Parity-Check Convolutional Code).

BACKGROUND ART

Recently, as an error correcting code to realize high error correction performance in a feasible circuit cost, an LDPC (Low-Density Parity-Check) code attracts attentions. An LDPC code provides high error correction performance and can be mounted in a simple manner, and is therefore adapted to error correction coding schemes such as the fast wireless LAN system in IEEE802.11n and a digital broadcast system.

An LDPC code is an error correcting code defined in a form of a low-density parity-check matrix H. That is, an LDPC code is a block code having the same length as the column length N of check matrix H.

However, like Ethernet (trademark), most of present communication systems have a feature of communicating transmission information on a per variable-length packet basis or on a per frame basis. If an LDPC code, which is a block code, is applied to such systems, for example, a problem arises in the method of applying a fixed-length LDPC code block to a variable-length Ethernet (trademark) frame. In IEEE802.11n, although padding and puncturing are applied to a transmission information sequence to adjust the transmission information sequence length and the LDPC code block length, if padding and puncturing are performed, it is difficult to prevent a change in the coding rate and redundant sequence transmission.

As such an LDPC code of a block code (hereinafter referred to as "LDPC-BC" (Low-Density Parity-Check Block Code)), an LDPC-CC (Low-Density Parity-Check Convolutional Code) is studied which can encode and decode an information sequence of an arbitrary length (e.g. see Non-Patent Document 1 and Non-Patent Document 2).

An LDPC-CC is a convolutional code defined by a low-density parity-check matrix, and, for example, FIG. 1 shows a parity-check matrix $H^T[0, n]$ of an LDPC-CC of coding rate R=½ (=b/c).

Here, the elements $h_1^{(m)}(t)$ and $h_2^{(m)}(t)$ in $H^T[0, n]$ have "0" or "1." Also, all the other elements than $h_1^{(m)}(t)$ and $h_2^{(m)}(t)$ included in $H^T[0, n]$ have "0." Also, M is the memory length in the LDPC-CC, and n is the codeword length of the LDPC-CC. As shown in FIG. 1, the LDPC-CC check matrix has features that the check matrix has a parallelogram shape, in which "1's" are assigned only to the diagonal elements and their surrounding elements in the matrix and "0's" are assigned to the lower left elements and upper right elements in the matrix.

Here, referring to the coding rate R=½ (=b/c) as an example, in the case of h1(0)(t)=1 and h2(0)(t)=1, the LDPC-CC is encoded by implementing the following equation based on check matrix $H^T[0, n]$.

(Equation 1)

$$v_{1,n} = u_n$$

$$v_{2,n} = \sum_{i=0}^{M} h_1^{(i)}(n) u_{n-i} + \sum_{i=1}^{M} h_2^{(i)}(n) v_{2,n-i}$$ [1]

Here, $u_n$ represents the transmission information sequence, and $v_{1,n}$ and $v_{2,n}$ represent the transmission codeword sequences.

FIG. 2 shows an example of an LDPC-CC encoder that implements equation 1.

As shown in FIG. 2, LDPC-CC encoder 10 is provided with shift registers 11-1 to 11-M and 14-1 to 14-M, weight multiplies 12-0 to 12-M and 13-0 to 13-M, weight control section 17, mod2 (i.e. exclusive disjunction calculation) adder 15 and bit number counter 16.

Shift registers 11-1 to 11-M and shift registers 14-1 to 14-M hold $v_{1,n-1}$ and $v_{2,n-1}$ (i=0, . . . , M), respectively, transmit the values to the right neighboring shift registers at the timing the next input is received, and hold the values transmitted from the left neighboring shift registers.

Weight multipliers 12-0 to 12-M and 13-0 to 13-M switch the values of $h_1^{(m)}$ and $h_2^{(m)}$ between 0 and 1, based on control signals transmitted from weight control section 17.

Weight control section 17 transmits the values of $h_1^{(m)}$ and $h_2^{(m)}$ at a timing to weight multipliers 12-0 to 12-M and 13-0 to 13-M, based on the number of counts transmitted from bit number counter 16 and a check matrix held in weight control section 17. By performing exclusive-OR of the outputs of weight multipliers 12-0 to 12-M and 13-0 to 13-M, mod2 adder 15 calculates $v_{2,n-1}$. Bit number counter 16 counts the number of bits of a transmission information sequence $u_n$ received as input.

By employing the above configuration, LDPC-CC encoder 10 can encode an LDPC-CC based on a check matrix.

An LDPC-CC encoder has a feature that this encoder can be realized with a very simple circuit, compared to a circuit that performs multiplication with a generation matrix and an LDPC-BC encoder that performs calculations based on the backward (forward) substitution method. Also, an LDPC-CC is an encoder for convolutional codes, so that it is not necessary to encode a transmission information sequence divided per fixed-length block, and it is possible to encode an information sequence of an arbitrary length.

By the way, it is possible to apply the sum-product algorithm to LDPC-CC decoding. Therefore, decoding algorithms that involve maximum likelihood sequence estimation such as the BCJR (Bahl, Cocke, Jeinek, Raviv) algorithm and the Viterbi algorithm, need not be used, so that it is possible to complete decoding processing with small processing delay. Further, a pipeline-type decoding algorithm is proposed utilizing the parallelogram shape of a check matrix in which "1's" are allocated (e.g. see Non-Patent Document 1).

If the decoding performances of an LDPC-CC and LDPC-BC are compared using parameters by which the circuit cost of the decoders are equal, it is shown that the decoding performance of an LDPC-CC is superior.

Non-Patent Document 1: A. J. Felstorom, and K. Sh. Zigangirov, "Time-Varying Periodic Convolutional Codes With Low-Density Parity-Check Matrix," IEEE Transactions on Information Theory, Vol. 45, No.6, pp 2181-2191, September 1999.

Non-Patent Document 2: G. Richter, M. Kaupper, and K. Sh. Zigangirov, "Irregular low-density parity-Check convolutional codes based on protographs," Proceeding of IEEE ISIT 2006, pp 1633-1637.

Non-Patent Document 3: B. Lu, G. Yue, and X. Wang, "Performance analysis and design optimization of LDPC-coded MIMO OFDM systems" IEEE Trans. Signal Processing., vol. 52, no. 2, pp. 348-361, February 2004.

Non-Patent Document 4: B. M. Hochwald, and S. ten Brink, "Achieving near-capacity on a multiple-antenna channel" IEEE Trans. Commun., vol. 51, no. 3, pp. 389-399, March 2003.

Non-Patent Document 5: S. Bäro, J. Hagenauer, and M. Wizke, "Iterative detection of MIMO transmission using a list-sequential (LISS) detector" Proceeding of IEEE ICC 2003, pp 2653-2657.

Non-Patent Document 6: M. Shen, G. Li, and H. Liu, "Effect of traffic channel configuration on the orthogonal frequency division multiple access down link performance" IEEE Transaction on Wireless Communications, vol. 4, no. 4, pp. 1901-1913, July 2005.

Non-Patent Document 7: T. Ohgane, T. Nishimura, and Y. Ogawa, "Applications of space division multiplexing and those performance in a MIMO channel," IEICE Trans. Commun., vol. E88-B, no. 5, pp. 1843-1851, May 2005.

Non-Patent Document 8: P. K. Vitthaladevuni, and M. S. Alouini, "BER computation of 4/M-QAM hierarchical constellations," IEEE Transaction on Broadcast., vol. 47, no. 3, pp. 228-239, September 2001.

Non-Patent Document 9: J. Hagenauer, "Rate-compatible punctured convolutional codes and their applications," IEEE Trans. Commun., vol. 43, no. 6, pp. 389-400, April 1988.

DISCLOSURE OF INVENTION

Problems to be Solved by the Invention

However, although the above LDPC-CC encoder has been argued under, mainly, the AWGN (Additive White Gaussian Noise) environment, this encoder has not been studied sufficiently in the fading environment in wireless communication.

Generally, although interleaving processing and retransmission processing are effective to improve received quality (i.e. error rate performance) in the fading environment, effective interleaving processing and retransmission processing for LDPC-CC's have not been studied sufficiently.

In view of the above, it is therefore an object of the present invention to provide a transmitting apparatus and transmitting method that can improve received quality on the receiving side when LDPC-CC coding processing is adopted.

Means for Solving the Problem

An aspect of the transmitting apparatus of the present invention employs a configuration having: an encoding section configured to encode a low-density parity-check convolutional code to form an encoded data; a sorting section configured to sort the encoded data acquired in the encoding section, into a first encoded data group corresponding to column numbers where there are "1's" in places outside protographs in a low-density parity-check convolutional code check matrix, and a second encoded data group corresponding to column numbers where there are non "1's" in places outside protographs in a low-density parity-check convolutional code check matrix; and a frame configuring section configured to generate a frame in which the first encoded data group and the second encoded data group are allocated to different positions in time or frequency in a frame.

An aspect of the transmitting apparatus of the present invention employs a configuration further having: a first interleaver that interleaves the first encoded data group; and a second interleaver that interleaves the second encoded data group, and in which the frame configuring section configures a transmission frame in which the first encoded data group interleaved in the first interleaver and the second encoded data group interleaved in the second interleaver are allocated to different positions in time or frequency in a frame.

An aspect of the transmitting apparatus of the present invention employs a configuration, in which, based on feedback information from a communicating party, the frame configuring section determines a position in frequency to which the first encoded data group is allocated.

An aspect of the transmitting apparatus of the present invention employs a configuration, in which, when a retransmission request is received, the frame configuring section retransmits the first encoded data group more preferentially than the second encoded data group.

An aspect of the transmitting apparatus of the present invention employs a configuration further having an M-ary modulation section that allocates the first encoded data group to fixed bits among a plurality of bits forming a symbol, and performs M-ary modulation.

An aspect of the transmitting method of the present invention includes: encoding a low-density parity-check convolutional code to form an encoded data; sorting the encoded data into a first encoded data group corresponding to column numbers where there are "1's" in places outside protographs in a low-density parity-check convolutional code check matrix, and a second encoded data group corresponding to column numbers where there are non "1's" in places outside protographs in a low-density parity-check convolutional code check matrix; allocating the first encoded data group and the second encoded data group to different positions in time or frequency in a frame; and transmitting the frame.

An aspect of the transmitting method of the present invention includes: a low-density parity-check convolutional code encoding step; a step of sorting encoded data acquired in the low-density parity-check convolutional code encoding step, into a first encoded data group corresponding to column numbers where there are "1's" in places outside protographs in a low-density parity-check convolutional code check matrix, and a second encoded data group corresponding to a rest of the column numbers; and a step of retransmitting the first encoded data group more preferentially than the second encoded data group.

ADVANTAGEOUS EFFECT OF THE INVENTION

The present invention sorts encoded data acquired in an LDPC-CC encoding section into a first encoded data group corresponding to column numbers where there are "1's" in places outside the protographs in an LDPC-CC check matrix, and a second encoded data group corresponding to the rest of the column numbers, and performs transmission, retransmission or mapping for protecting the first encoded data group particularly, so that it is possible to improve the error rate performance upon sum-product decoding and acquire received data of good error rate performance on the receiving side.

BRIEF DESCRIPTION OF DRAWINGS

FIG. 1 shows a parity-check matrix $H^T[0, n]$;

FIG. 3 shows an example of an LDPC-CC cheek matrix;

FIG. 8A shows writing and reading operations in/from a memory, FIG. 8B shows the order of data before interleaving and FIG. 8C shows the order of data after interleaving;

FIG. 9A shows writing and reading operations in/from a memory, FIG. 9B shows the order of data before interleaving and FIG. 9C shows the order of data after interleaving;

FIG. 19A shows a characteristic curve for channel variation, FIG. 19B shows subcarriers in ascending order of received field intensity and FIG. 19C shows relationships of subcarriers with which significant bits are transmitted;

FIG. 20A shows a characteristic curve for channel variation, FIG. 20B shows subcarrier blocks in ascending order of received field intensity and FIG. 20C shows relationships of subcarrier blocks with which significant bits are transmitted;

BEST MODE FOR CARRYING OUT THE INVENTION

Figure 2:
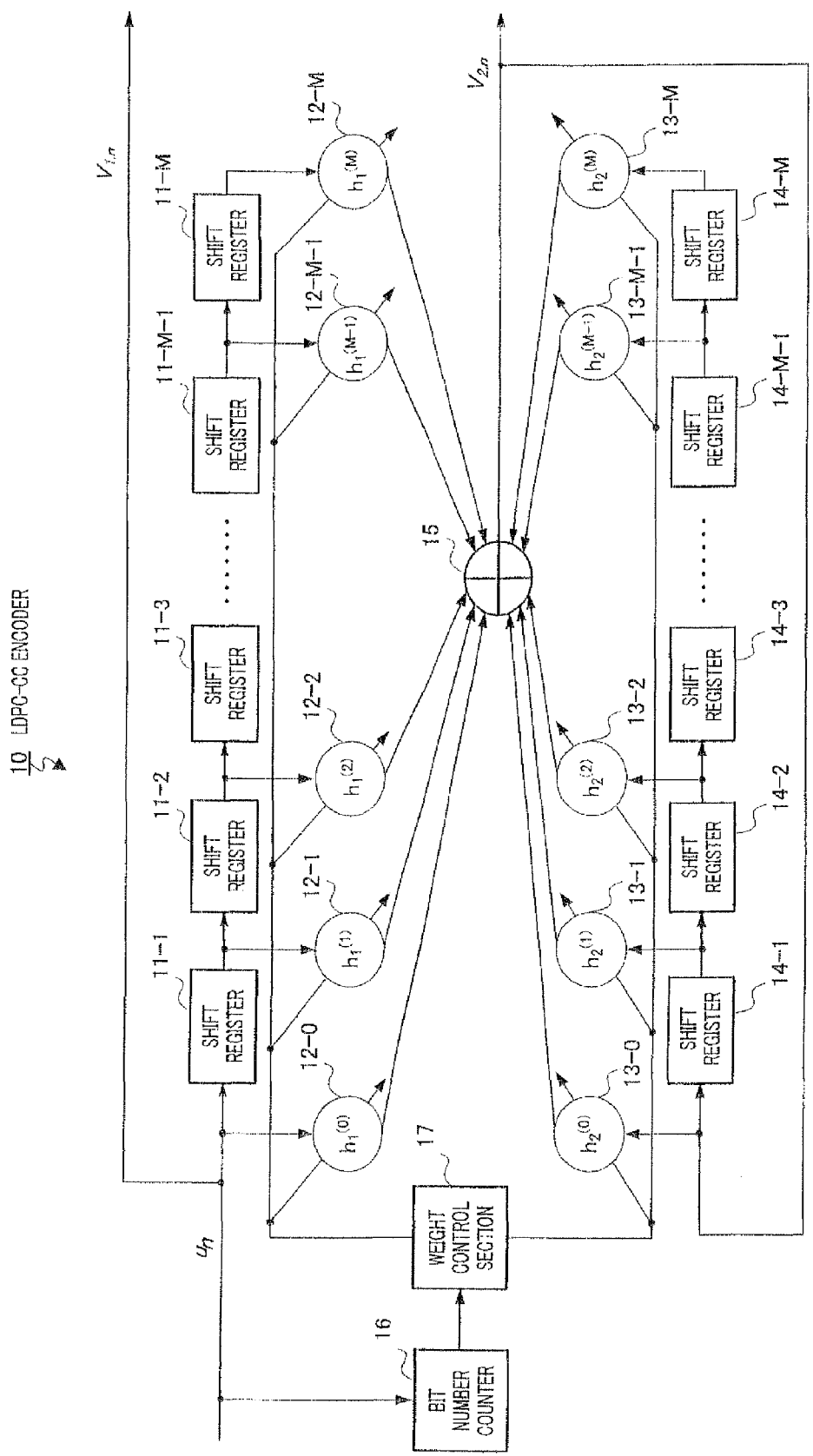
FIG. 2 is a block diagram showing the configuration of a conventional LDPC-CC encoder.

Embodiments of the present invention will be explained below in detail with reference to the accompanying drawings.

(Fundamentals)

First, before explaining the specific configuration and operations according to embodiments, the fundamentals of the present invention will be explained.

In LDPC code, coding data (i.e. codeword) is acquired by multiplying information vector n by generation matrix G. That is, coding data (codeword) c can be represented by c=n×G. Here, the generation matrix G is calculated based on check matrix H a designed in advance. To be more specific, the generation matrix G satisfies G×$H^T$=0.

Figure 3:
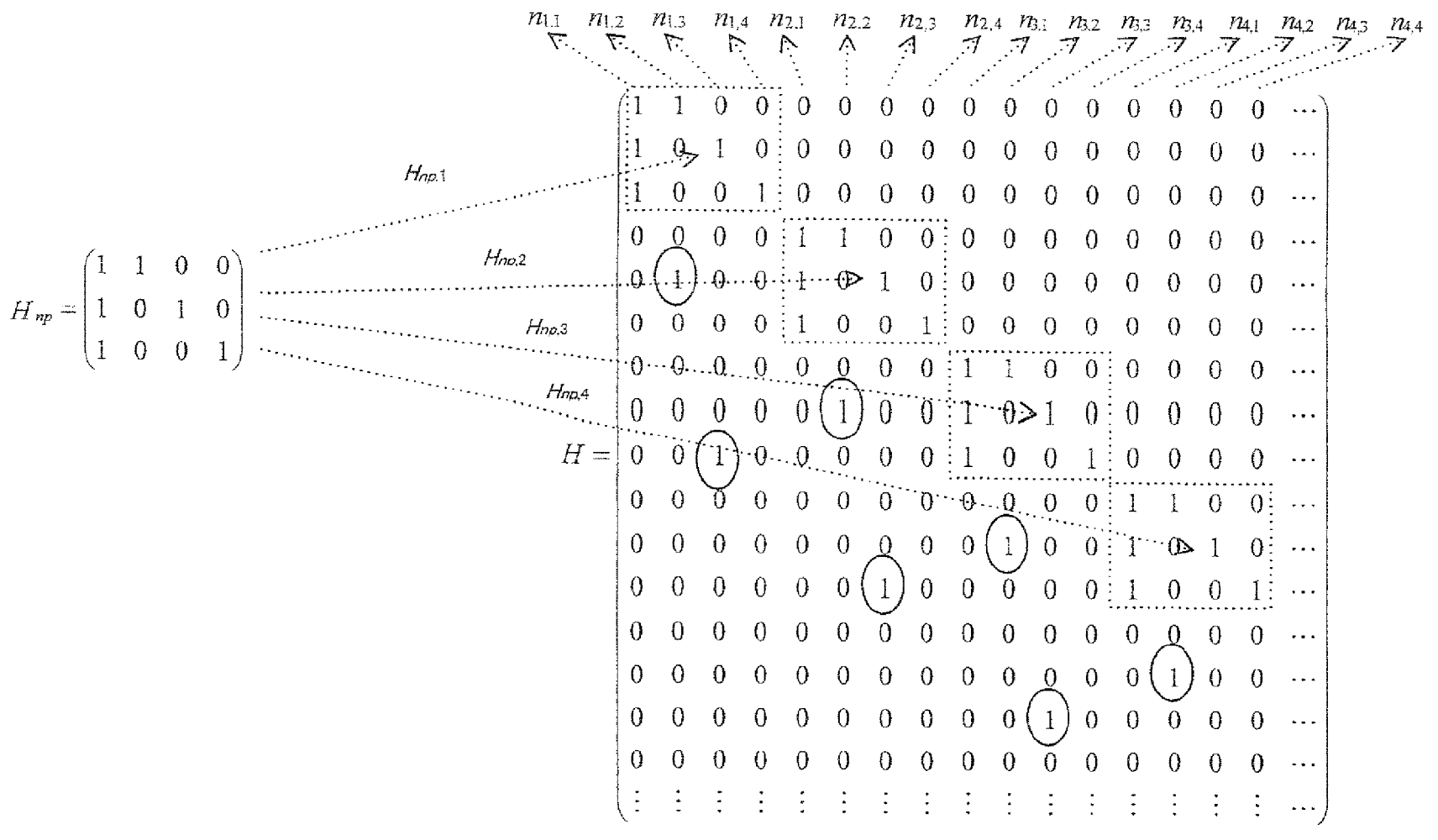

FIG. 3 shows an example of check matrix H of an LDPC-CC according to an embodiment. In FIG. 3, the matrixes $H_{np}$ surrounded by the dotted lines in check matrix H are referred to as "protographs." Cheek matrix H includes a plurality of protographs like $H_{np,1}$, $H_{np,2}$, $H_{np,3}$, $H_{np,4}$, and so on. Further, additionally, in check matrix H, "1's" are allocated to the positions surrounded by a circle in the figure. The "1's" allocated to positions apart from the protographs in check matrix H, are used to integrate likelihoods on the decoding side (i.e. receiving side).

The sum-product decoding algorithm on the receiving side is as follows.

In the following explanation, assume that a binary (M×N) matrix H={$H_{mn}$} is the check matrix of an LDPC code that is the decoding target. Subsets A(m) and B(n) in set [1, N]={1, 2, ..., N} are defined as shown in the following equations.

$$A(m) \equiv \{n : H_{mn} = 1\} \quad \text{(Equation 2)}$$

$$B(n) \equiv \{m : H_{mn} = 1\} \quad \text{(Equation 3)}$$

Here, A(m) indicates a set of column indices with "1" in the m-th row of check matrix H, and B(n) indicates a set of row indices with "1" in the n-th row of the check matrix.

Step A•1 (initialization): priori value logarithm ratio $\beta_{mn}$=0 is set for all combinations (m, n) fulfilling $H_{mn}$=1. Also, loop variable number (i.e. the number of iterations) $1_{sum}$=1 is set, and the maximum number of loops $1_{sum,max}$ is set.

Step A•2 (row processing): an extrinsic value logarithm ratio $\alpha_{mn}$ is updated for all combinations (m, n) fulfilling $H_{mn}$=1 in the order from m=1, 2, ..., M, using the following updating equations.

(Equation 4)

$$\alpha_{mn} = \left( \prod_{n' \in A(m) \setminus n} \text{sign}(\beta_{mn'}) \right) \times f\left( \sum_{n' \in A(m) \setminus n} f(|\beta_{mn'}|) \right) \quad [4]$$

(Equation 5)

$$\text{sign}(x) \equiv \begin{cases} 1 & x \geq 0 \\ -1 & x < 0 \end{cases} \quad [5]$$

-continued (Equation 6)

$$f(x) \equiv \ln \frac{\exp(x)+1}{\exp(x)-1} \quad [6]$$

Here, f represents the Gallager function, and $\lambda_n$ represents the log-likelihood per bit.

Step A•3 (column processing): an extrinsic value logarithm ratio $\beta_{mn}$ is updated for all combinations (m, n) fulfilling $H_{mn}=1$ in the order from n=2, . . . , N, using the following updating equation.

(Equation 7)

$$\beta_{mn} = \lambda_n + \sum_{m' \in B(n) \setminus m} \alpha_{m'n} \quad [7]$$

Step A•4 (calculdation of log-likelihood): a log-likelihood $L_n$ in n∈[1, N] is calculated as shown below.

(Equation 8)

$$L_n = \lambda_n + \sum_{m' \in B(n)} \alpha_{m'n} \quad [8]$$

Step A•5 (the count of the number of iterations): if $1_{sum} < 1_{sum,max}$, $1_{sum}$ is incremented, and the step returns to step A•2. In the case of $1_{sum} = 1_{sum,max}$, sum-product decoding is finished, and an estimated sequence of a transmission sequence is acquired based on the log-likelihood $L_n$.

By the way, as shown in FIG. 3, the bits forming a transmission bit sequence (i.e. information bit sequence) acquired by coding processing of an LDPC-CC, such as $n_{1,1}, n_{1,2}, n_{1,3}, n_{1,4}, n_{2,1}, n_{2,2}, n_{2,3}, n_{2,4}, n_{3,1}, n_{3,2}, n_{3,3}, n_{3,4}, n_{4,1}, n_{4,2}, n_{4,3}, n_{4,4}$, and so on, correspond to the columns of check matrix H. This is because a check equation $Hw^T$ is equal to 0. Here, a vector w is represented by $n_{1,1}, n_{1,2}, n_{1,3}, n_{1,4}, n_{2,1}, n_{2,2}, n_{2,3}, n_{2,4}, n_{3,1}, n_{3,2}, n_{3,3}, n_{3,4}, n_{4,1}, n_{4,2}, n_{4,3}, n_{4,4}$, and so on.

As shown in FIG. 3, the log-likelihood $\lambda_n$ per bit, which is used upon sum-product decoding, is arranged for check matrix H in the order from $n_{1,1}, n_{1,2}, n_{1,3}, n_{1,4}, n_{2,1}, n_{2,2}, n_{2,3}, n_{2,4}, n_{3,1}, n_{3,2}, n_{3,3}, n_{3,4}, n_{4,1}, n_{4,2}, n_{4,3}, n_{4,4}$, and so on.

Figure 4:
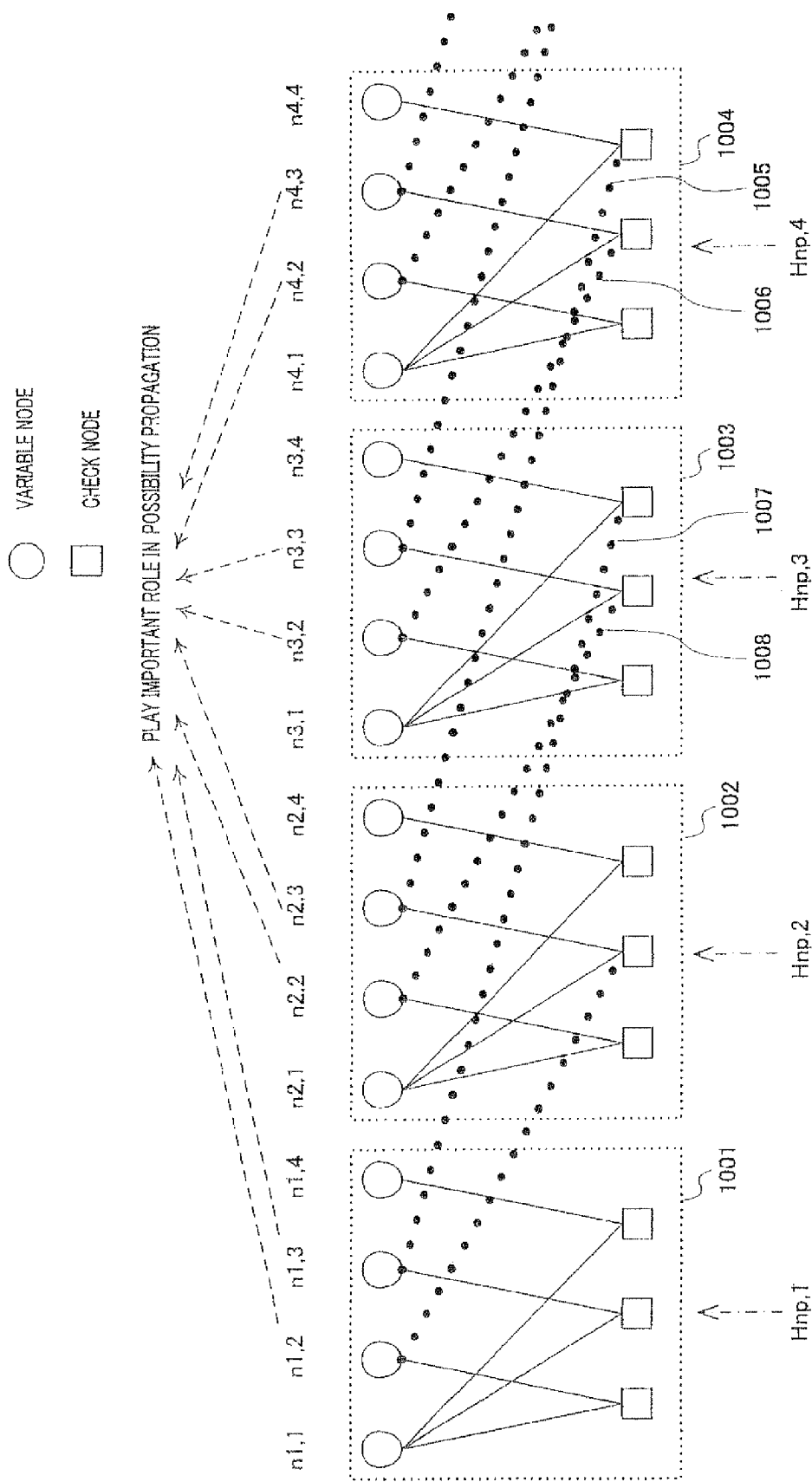
FIG. 4 illustrates the Tanner graph.

FIG. 4 shows the Tanner graph prepared based on the check matrix in FIG. 3. In FIG. 4, the Tanner graph surrounded by dotted lines represented by reference numeral 1001 relates to protograph $H_{np,1}$ (where the region inside the dotted lines corresponds to the Tanner graph for the protograph). Similarly, the Tanner graph surrounded by dotted lines represented by reference numeral 1002 relates to protograph $H_{np,2}$, the Tanner graph surrounded by dotted lines represented by reference numeral 1003 relates to protograph $H_{np,3}$, and the Tanner graph surrounded by dotted lines represented by reference numeral 1004 relates to protograph $H_{np,4}$.

Also, in FIG. 4, dotted lines connecting variable nodes and cheek nodes correspond to the edges of "1's" surrounded by circles in check matrix H of FIG. 3.

In sum-product decoding, the probability is propagated based on the Tanner graphs of FIG. 4. In this case, the positions of edges connecting variable nodes and check nodes play an important role in probability propagation. In FIG. 4, to propagate the possibility acquired by the Tanner graphs corresponding to protographs, especially, dotted-line edges play a very important role. That is, "1" surrounded by a circle in the check matrix of FIG. 3 plays an important role in possibility propagation.

For example, the edge that plays a role of propagating the possibility acquired by protograph $H_{np,4}$ to the protograph $H_{np,3}$, is represented by dotted line 1006. Similarly, the edge that plays a role of propagating the possibility acquired by protograph $H_{np,4}$ to protograph $H_{np,2}$, is represented by dotted line 1005.

Also, referring to protograph $H_{np,3}$, the edge that plays a role of propagating the possibility acquired by protograph $H_{np,3}$ to protograph $H_{np,1}$, is represented by dotted line 1007. Similarly, the edge that plays a role of propagating the possibility acquired by protograph $H_{np,3}$ to protograph $H_{np,2}$, is represented by dotted line 1008.

As described above, among the transmission bit sequences corresponding to the column numbers of check matrix H acquired from LDPC-CC coding processing, transmission bit sequences $n_{k,2}$ and $n_{k,3}$ (k=1, 2, 3, 4, 5, . . . ) corresponding to column numbers where there are "1's" in places not related to protographs, play an important role in probability propagation.

The present invention is made with reference to the presence of such transmission bit sequences $n_{k,2}$ and $n_{k,3}$ (k=1, 2, 3, 4, 5, . . . ) that play an important role in possibility propagation to improve received quality.

Especially, the present invention improves received quality by devising a transmitting method and retransmitting method of a transmission bit sequence, from a viewpoint that, among transmission bit sequences corresponding to column numbers of check matrix H, transmission sequences corresponding to column numbers where there are "1's" in places not related to protographs, are important to improve received quality.

(Embodiment 1)

Figure 5:
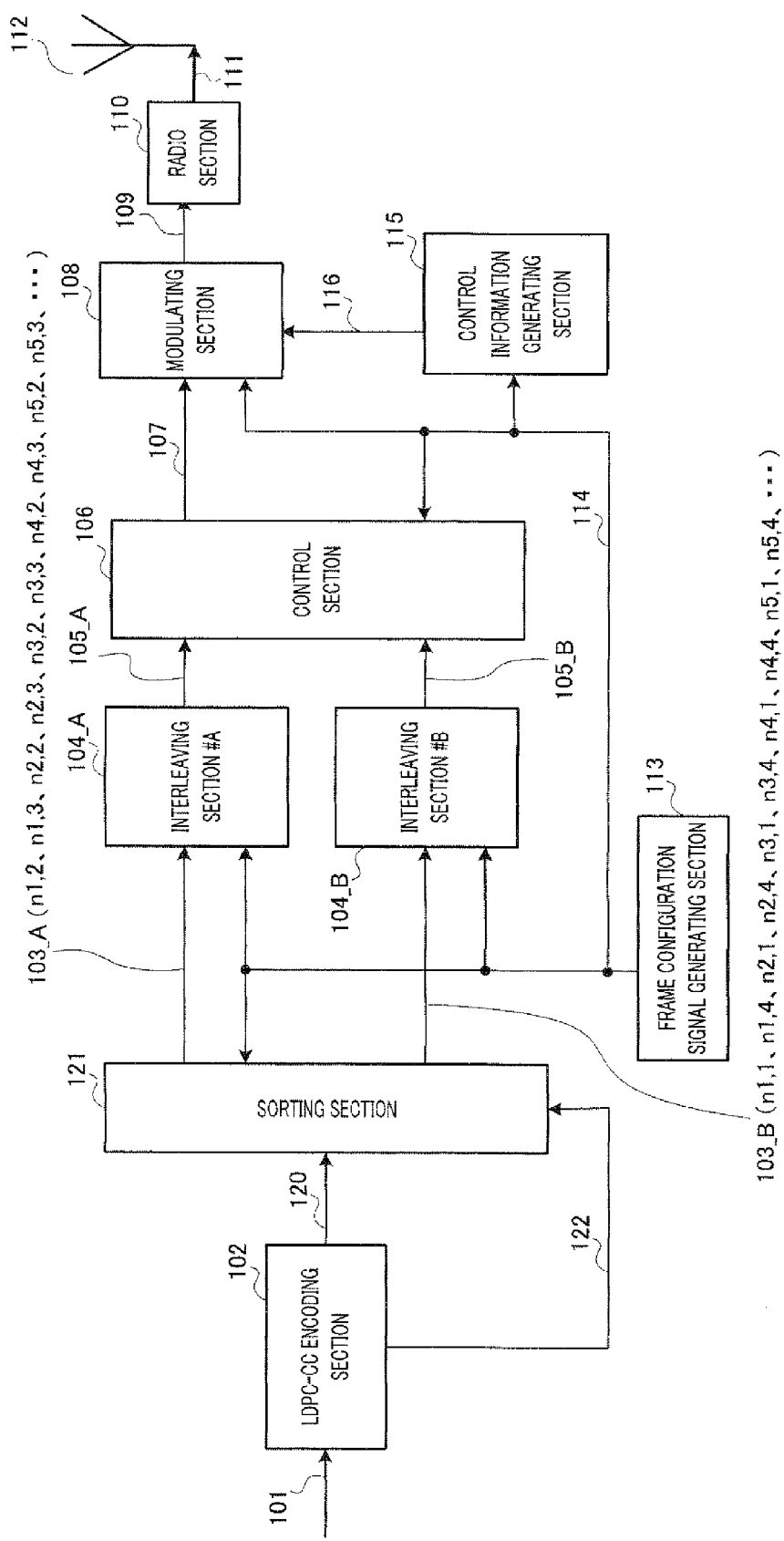
FIG. 5 is a block diagram showing a configuration example of a transmitting apparatus according to Embodiment 1 of the present invention.

FIG. 5 shows a configuration example of a transmitting apparatus according to Embodiment 1 of the present invention.

Transmitting apparatus 100 receives as input transmission digital signal 101 in LDPC-CC encoding section 102. LDPC-CC encoding section 102 generates encoded data 120 by encoding an LDPC-CC and outputs encoded data 120 to sorting section 121.

Sorting section 121 receives as input positional information 122 about the positions represented by circles in FIG. 3 (i.e. information about the positions of "1's" among positions outside protographs in the check matrix) from LDPC-CC encoding section 102, in addition to encoded data 120. Sorting section 121 then sorts encoded data 120 into transmission bit sequences associated with the column numbers indicated by positional information 122 (i.e. encoded data #A (103_A)) and transmission bit sequences corresponding to the other column numbers (i.e. encoded data #B (103_B)). Further, sorting section 121 outputs encoded data #A (103_A) to interleaving section #A (104_A) and encoded data #B (103_B) to interleaving section #B (104_B).

Here, although a case has been described with the present embodiment where LDPC-CC encoding section 102 holds information associated with a check matrix and outputs positional information 122 from LDPC-CC encoding section 102 to sorting section 121, for example, if sorting section 121 holds positional information 122 about a check matrix, LDPC-CC encoding section 102 needs not output positional information 122 to sorting section 121.

Interleaving section #A (104_A) receives as input encoded data #A (103_A) and frame configuration signal 114 from frame configuration signal generating section 113, interleaves encoded data #A (103_A) based on the frame configuration of frame configuration signal 114, and outputs resulting interleaved data #A (105_A) to control section 106.

Interleaving section #B (104_B) receives as input encoded data #B (103_B) and frame configuration signal 114, interleaves encoded data #B (103_B) based on the frame configuration of frame configuration signal 114, and outputs resulting interleaved data #B (105_B) to control section 106.

Control section 106 rearranges interleaved data #A (105_A) and interleaved data #B (105_B) in the order according to frame configuration signal 114, and outputs rearranged data 107 to modulating section 108.

Modulating section 108 receives as input rearranged data 107, control information 116 from control information generating section 115 and frame configuration signal 114 from frame configuration signal generating section 113, produces modulated signal 109 by modulating rearranged data 107 and control information 116 according to frame configuration signal 114, and outputs modulated signal 109 to radio section 110.

Radio section 110 produces transmission signal 111 by performing predetermined radio processing such as frequency conversion and amplification on the modulated signal, and outputs transmission signal 111 from antenna 112 as a radio wave.

Here, frame configuration signal generating section 113 generates a signal including information about the frame configuration, as frame configuration signal 114. Also, control information generating section 115 receives as input frame configuration signal 114, and generates control information 116 including information for allowing the communicating party to find frequency synchronization or time synchronization and information for reporting the modulation scheme of a modulation signal to the communicating party.

Figure 6:
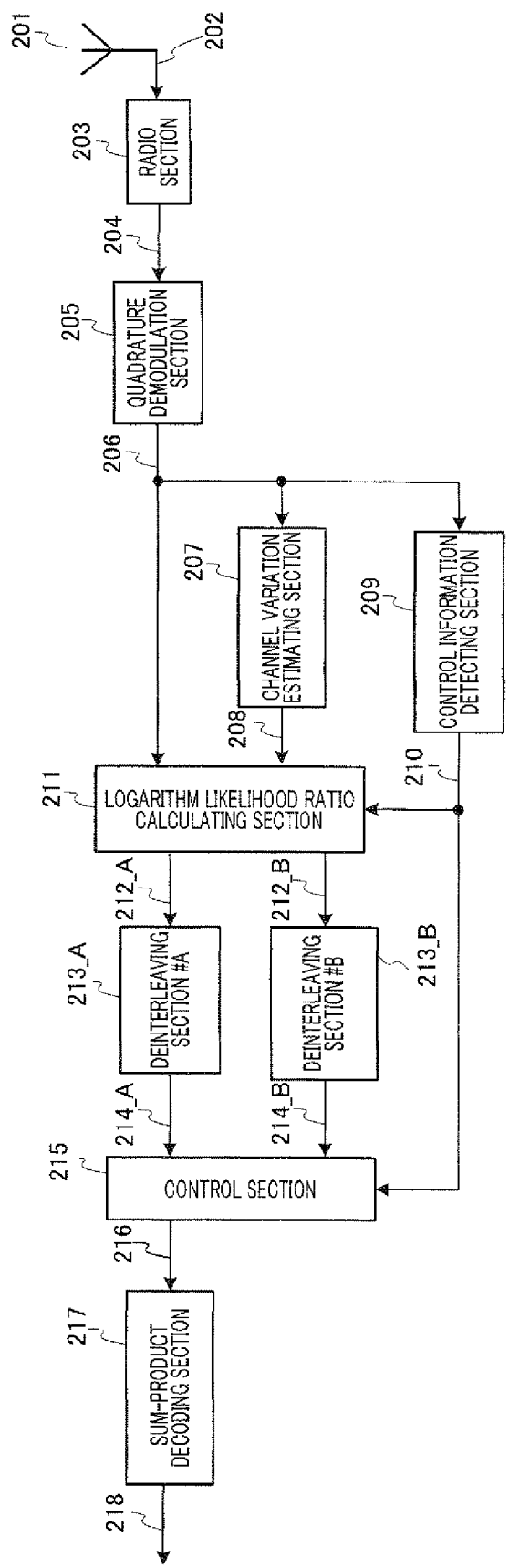
FIG. 6 is a block diagram showing a configuration example of a receiving apparatus according to Embodiment 1.

FIG. 6 shows a configuration example of a receiving apparatus that receives a signal transmitted from transmitting apparatus 100 of FIG. 5. In receiving apparatus 200, radio section 203 receives as input received signal 202 received by receiving antenna 201. Radio section 203 produces modulated signal 204 by performing predetermined radio processing such as frequency conversion and amplification on received signal 202, and outputs modulated signal 204 to quadrature demodulation section 205.

Quadrature demodulation section 205 produces baseband signal 206 by performing quadrature demodulation of modulated signal 204. Channel variation estimating section 207 receives as input baseband signal 206, produces channel variation estimation signal 208 by, for example, detecting the preamble included in baseband signal 206 and estimating channel variations based on the preamble, and outputs channel variation estimation signal 208 to log-likelihood ratio calculating section 211.

Control information detecting section 209 receives as input baseband signal 206, detects the preamble included in baseband signal 206 and finds time synchronization or frequency synchronization based on the preamble. Also, control information detecting section 209 detects control information included in baseband signal 206 and outputs the control information as control signal 210.

Log-likelihood ratio calculating section 211 receives as input baseband signal 206, channel variation estimation signal 208 and control signal 210. As shown in, for example, Non-Patent Documents 3, 4 and 5, log-likelihood ratio calculating section 211 calculates log-likelihood ratios on a per bit basis, based on channel variation estimation signal 208 and baseband signal 206, divides these log-likelihood ratios into, for example, two types as in sorting section 121 of transmitting apparatus 100 of FIG. 5, and outputs log-likelihood ratio signal #A (212_A) and log-likelihood ratio signal #B (212_B).

Deinterleaving section #A (213_A) receives as input log-likelihood ratio signal #A (212_A) and produces deinterleaved log-likelihood ratio #A (214_A) by performing deinterleaving opposite to the interleaving in interleaving section #A (104_A). Similarly, deinterleaving section #B (213_B) receives as input log-likelihood ratio signal #B (212_B) and produces deinterleaved log-likelihood ratio #B (214_B) by performing deinterleaving opposite to the interleaving in interleaving section #B (104_B).

Control section 215 receives as input deinterleaved log-likelihood ratio #A (214_A), deinterleaved log-likelihood ratio #B (214_B) and control signal 210, rearranges deinterleaved log-likelihood ratio #A (214_A) and deinterleaved log-likelihood ratio #B (214_B) based on control signal 210, and outputs rearranged log-likelihood ratio 216.

Sum-product decoding section 217 receives as input rearranged log-likelihood ratio 216 and produces received data 218 by performing sum-product decoding using rearranged log-likelihood ratio 216.

Next, the operations of transmitting apparatus 100 according to the present embodiment will be explained.

As shown in FIG. 5, sorting section 121 of transmitting apparatus 100 divides a transmission bit sequence (encoded data) $n_{1,1}, n_{1,2}, n_{1,3}, n_{1,4}, n_{2,1}, n_{2,2}, n_{2,3}, n_{2,4}, n_{3,1}, n_{3,2}, n_{3,3}, n_{3,4}, n_{4,1}, n_{4,2}, n_{4,3}, n_{4,4}, \ldots$, acquired by LDPC-CC coding, into significant bits for probability propagation, $n_{k,2}$ and $n_{k,3}$ ($k=1, 2, 3, 4, 5, \ldots$), and the rest of the bits, $n_{k,1}$ and $n_{k,4}$ ($k=1, 2, 3, 4, 5, \ldots$).

Further, sorting section 121 outputs the significant bits for probability propagation, $n_{k,2}$ and $n_{k,3}$ ($k=1, 2, 3, 4, 5, \ldots$), to interleaving section #A as encoded data #A (103_A) and outputs $n_{k,1}$ and $n_{k,4}$ ($k=1, 2, 3, 4, 5, \ldots$), to interleaving section #B as encoded data #B (103_B).

By this means, it is possible to perform interleaving using only encoded data #A ($n_{k,2}$ and $n_{k,3}$ ($k=1, 2, 3, 4, 5, \ldots$)) and generate interleaved data #A (105_A). Similarly, it is possible to perform interleaving using only encoded data #B ($n_{k,1}$ and $n_{k,4}$ ($k=1, 2, 3, 4, 5, \ldots$)) and generate interleaved data #B (105_B).

Control section 106 has a function as a frame configuration means for configuring a transmission frame in which interleaved data #A (105_A) and interleaved data #B (105_B) are allocated to different positions in time or frequency in the frame.

Control section 106 combines data interleaved in interleaving section #A and data interleaved in interleaving section #B such that the frame configuration of modulated signal 109 outputted from modulating section 108 is as shown in, for example, FIG. 7A or FIG. 7B.

Figure 7:
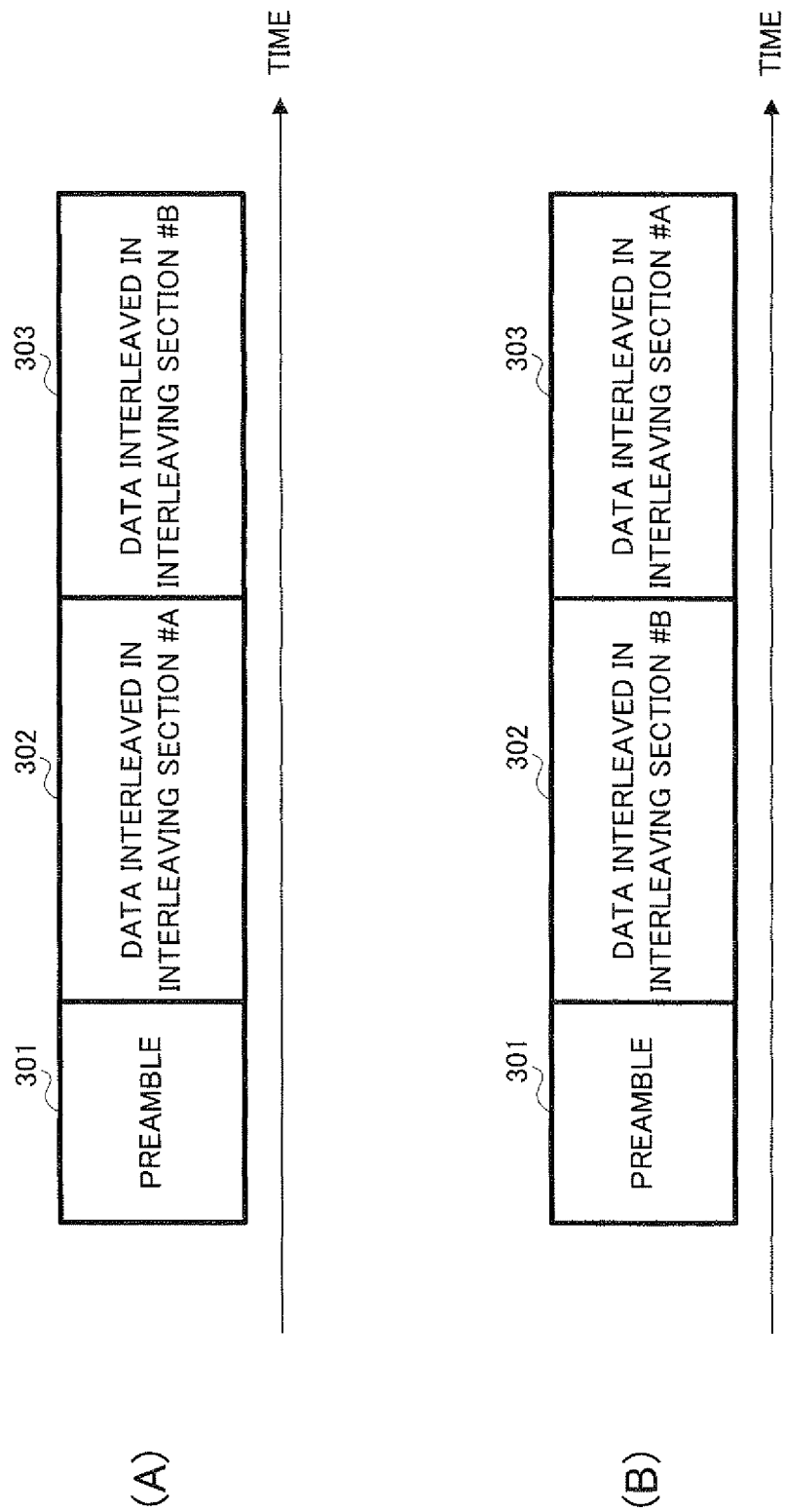
FIG. 7 shows a configuration example of a transmission frame.

In FIG. 7A and FIG. 7B, the horizontal axis represents time. FIG. 7A and FIG. 7B show examples where interleaved data #A (105_A) and interleaved data #B (105_B) are allocated to different positions in time in a frame. In FIG. 7, reference code 301 is a preamble and is a symbol for transmitting, for example, information for allowing the communicating party to find frequency synchronization or time synchronization, information for reporting the modulation scheme of a modulated signal to the communicating part, and a known signal for estimating channel variation. Reference code 302 is a symbol for transmitting data interleaved in interleaving section #A (104_A), and reference code 303 is a symbol for transmitting data interleaved in interleaving section #B (104_B).

Here, as shown in FIG. 7A and FIG. 7B, symbol 302 for transmitting data interleaved in interleaving section #A (104_A) and symbol 303 for transmitting data interleaved in interleaving section #B (104_B) are allocated apart on the time axis, so that it is possible to realize probability propagation with alleviated influence of fading variations.

For example, the effects will be explained in the case of performing allocation as shown in FIG. 7A. Except when the speed of fading variation is extremely slow, there is a low possibility that symbol 302 for transmitting data interleaved in interleaving section #A and symbol 303 for transmitting data interleaved in interleaving section 303, both have lower received field intensity, and one of the symbols has increased received field intensity.

That is, one of symbol 302 and symbol 303 can ensure high received quality. By this means, as understood from the Tanner graph in FIG. 4, according to the relationships of probability propagation between protographs, it is possible to alleviate the influence of degradation of received field intensity due to the influence of fading. This is because the log-likelihood ratio of high received field intensity always is present in protographs.

Figure 8:
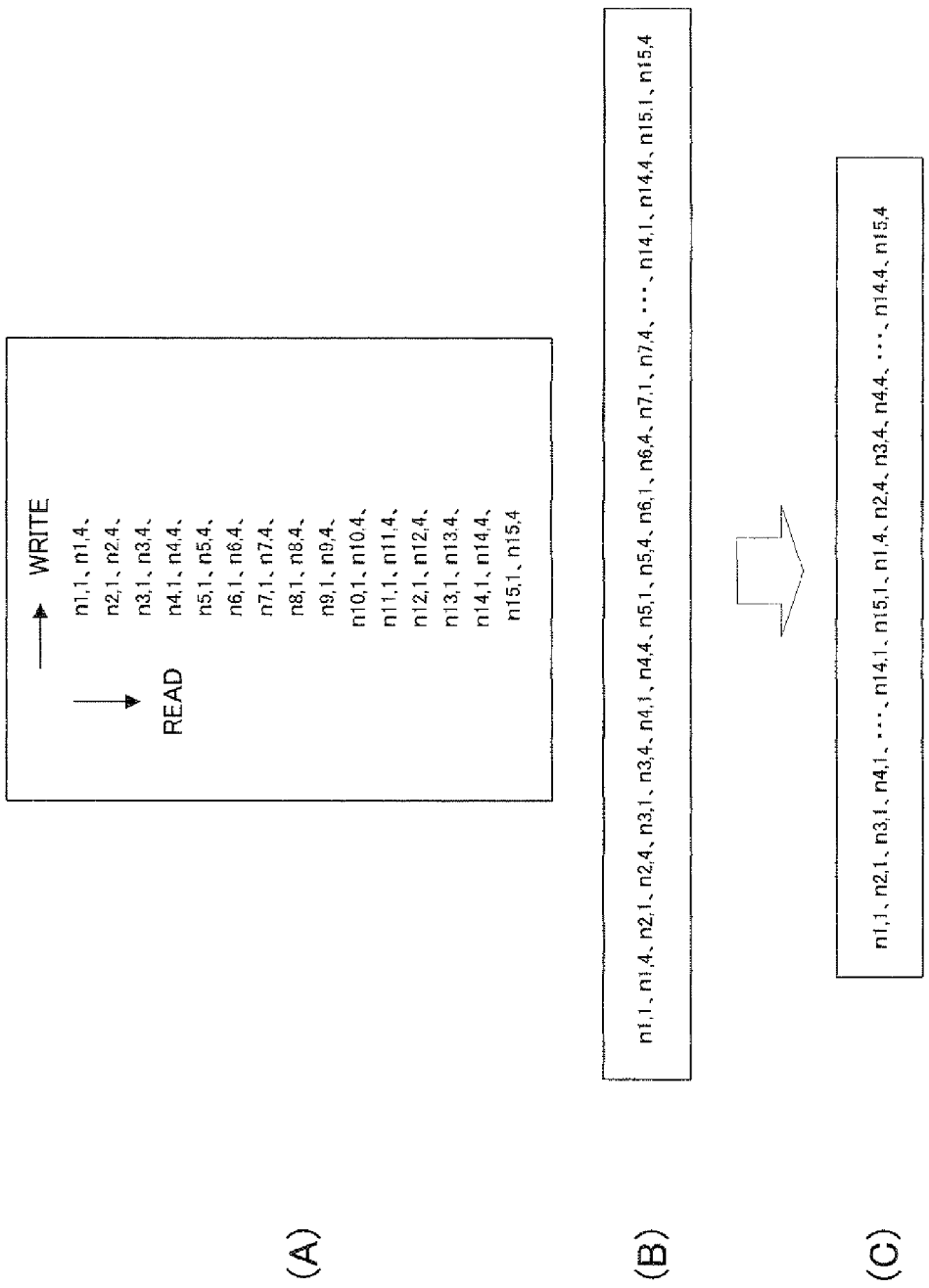
FIG. 8 illustrates interleaving processing.
Figure 9:
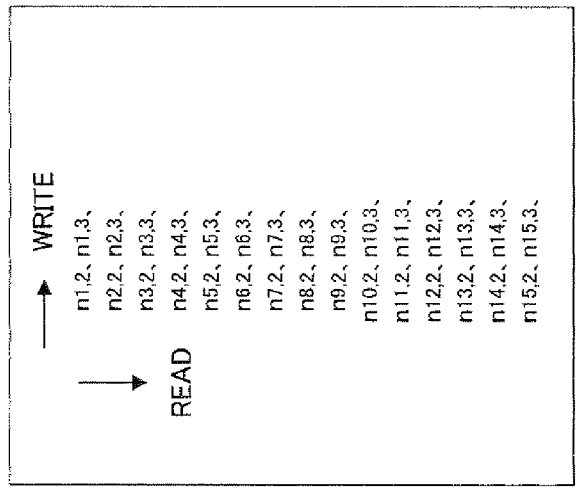
FIG. 9 illustrates interleaving processing.
Figure 9:
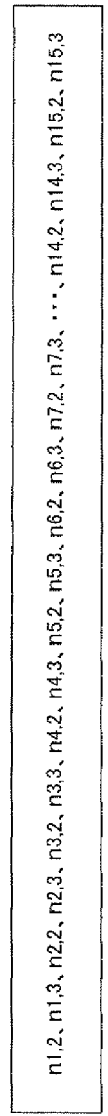
Figure 9:
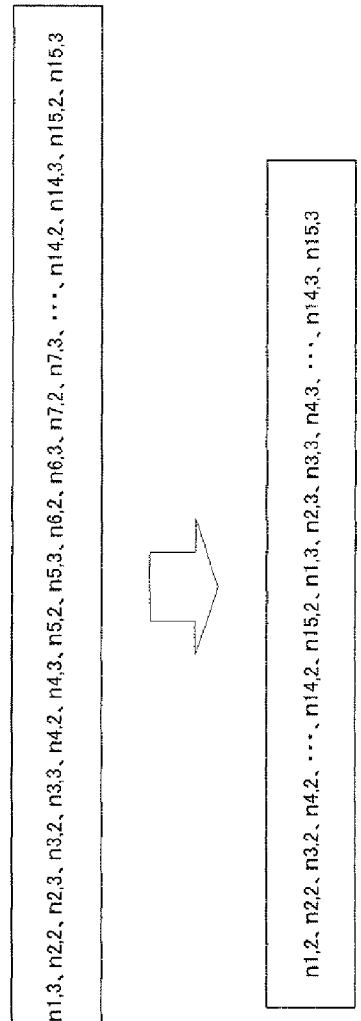

Next, an example of an interleaving method will be explained in detail using FIG. 8 and FIG. 9. FIG. 8 and FIG. 9 illustrate cases where block interleaving is performed, as an example of an interleaving method.

FIG. 8 shows an example of interleaving processing in interleaving section #B (104_B) of FIG. 5. As shown in FIG. 8A, input data $n_{1,1}$, $n_{1,4}$, $n_{2,1}$, $n_{2,4}$, $n_{3,1}$, $n_{3,4}$, $n_{4,1}$, $n_{4,4}$, and so on, received as input in order, are written in a memory horizontally and then written downward in order. Next, data is read out vertically, and, after that, data is read out rightward in order. By this processing, data received as input in the order shown in FIG. 8B is interleaved, so that data is outputted in the order shown in FIG. 8C.

FIG. 9 shows an example of interleaving processing in interleaving section #A (104_A) of FIG. 5. The same block interleaving as in FIG. 8 is performed for input data $n_{1,2}$, $n_{1,3}$, $n_{2,2}$, $n_{2,3}$, $n_{3,2}$, $n_{3,3}$, $n_{4,2}$, $n_{4,3}$, and so on, received as input in order. That is, by performing writing and reading processing on the memory as shown in FIG. 9A, data received as input in the order shown in FIG. 9B is interleaved, so that data is outputted in the order shown in FIG. 9C.

Also, the method of interleaving is not limited to the methods shown in FIG. 8 and FIG. 9, and, ideally, random interleaving is preferable. Here, what interleaving method is adopted is not an essential to the present invention, and, even when the block interleaving method shown in FIG. 8 and FIG. 9 is adopted, it is possible to provide a significant effect of improving received quality.

As described above, the present embodiment provides: LDPC-CC encoding section 102; sorting section 121 that sorts encoded data acquired in LDPC-CC encoding section 102 into first encoded data group 103_A corresponding to column numbers where there are "1's" in places outside protographs in an LDPC-CC check matrix H, and second encoded data group 103_B corresponding to the rest of the column numbers; and a frame configuration section (control section 106) that configures a transmission frame in which first encoded data group 103_A and second encoded data group 103_B are allocated to different positions in time or frequency in the frame. By this means, in the Tanner graph prepared in sum-product decoding section 217 of receiving apparatus 200, even in the fading environment, it is possible to always provide log-likelihood ratios of high received field intensity in protographs, and, as a result, acquire received data 218 of good error rate performance.

Also, although the frame configuration shown in FIG. 7 has been described with the present embodiment as an example of a transmission frame configuration, the present invention is not limited to this, and an essential requirement is to configure a transmission frame in which first encoded data group 103_A and second encoded data group 103_B are allocated to different positions in time or frequency in the frame. For example, even if another symbol (such as a data symbol and control symbol) is inserted between first encoded data group 103_A and second encoded data group 103_B, it is possible to provide the same effect as above.

Although an example case has been described above with the present embodiment where the present invention is applied to single carrier communication, it is equally possible to apply the present invention to multicarrier communication. Next, an embodiment will be explained where the present invention is applied to multicarrier communication. Specifically, an example case will be explained where the present invention is applied to OFDM (Orthogonal Frequency Division Multiplexing) communication.

Figure 10:
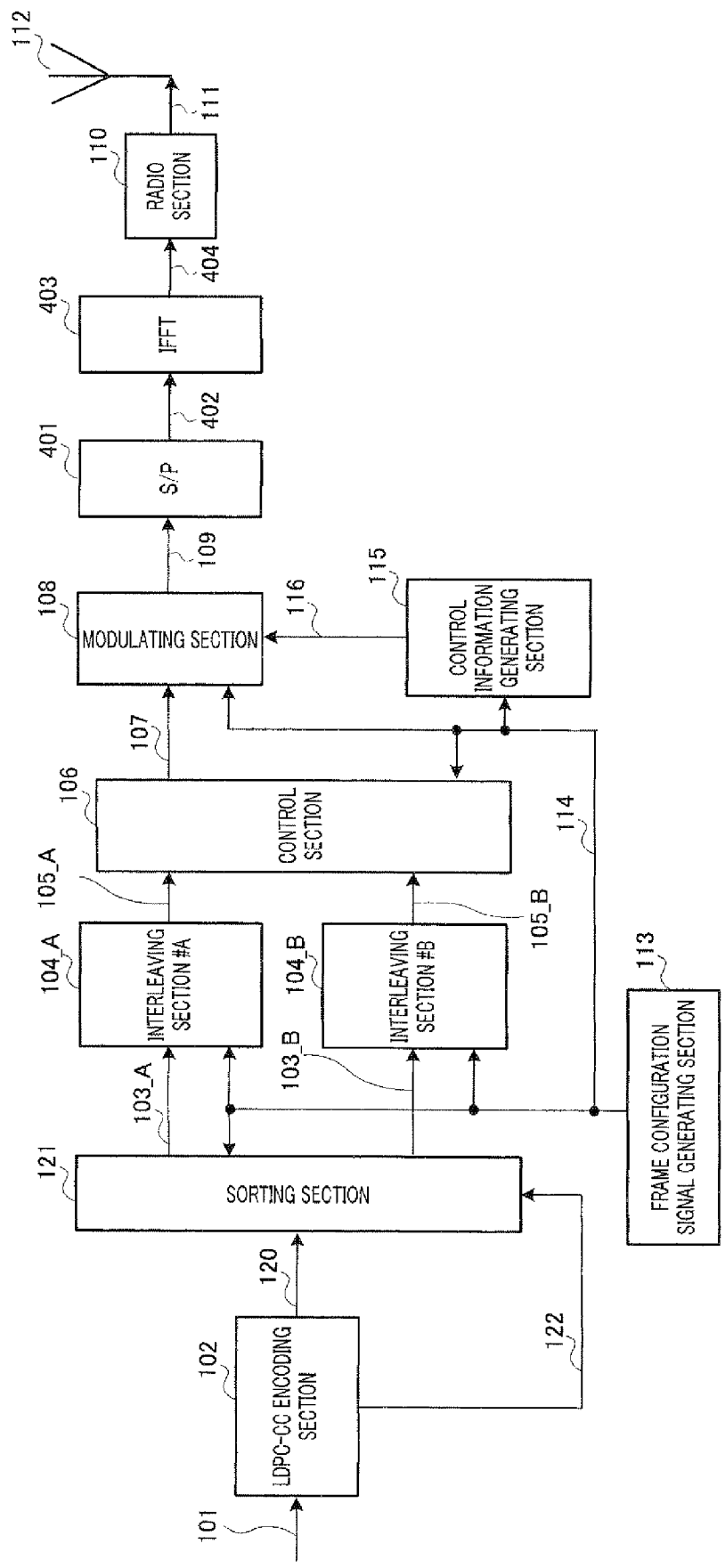
FIG. 10 is a block diagram showing a configuration example of a transmitting apparatus according to Embodiment 1.

In FIG. 10 in which the same components as in FIG. 5 are assigned the same reference numerals, serial-to-parallel ("S/P") conversion section 401 of transmitting apparatus 400 receives as input modulated signal 109 acquired from modulating section 108.

S/P conversion section 401 performs serial-to-parallel conversion on modulated signal 109 and outputs parallel signal 402 to inverse fast Fourier transform ("IFFT") section 403. IFFT section 403 performs an IFFT of parallel signal 402 and outputs signal 404 subjected to IFFT to radio section 110.

Figure 11:
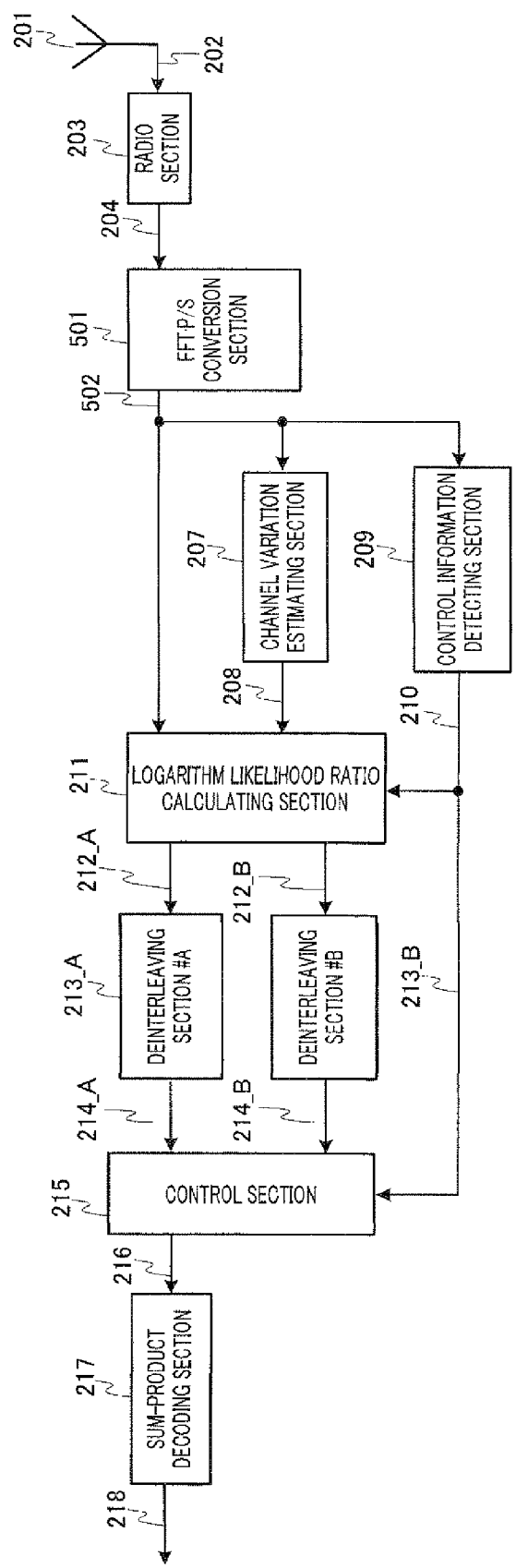
FIG. 11 is a block diagram showing a configuration example of a receiving apparatus according to Embodiment 1.

FIG. 11, in which the same components as in FIG. 6 are assigned the same reference numerals, shows a configuration example of a receiving apparatus that receives a signal transmitted from transmitting apparatus 400 in FIG. 10.

In receiving apparatus 500, FFT•P/S conversion section 501 receives as input modulated signal 204 outputted from radio section 203. FFT•P/S conversion section 501 performs FFT processing of modulated signal 204 and then performs parallel-to-serial conversion processing of the result, and outputs resulting baseband signal 502.

Figure 12:
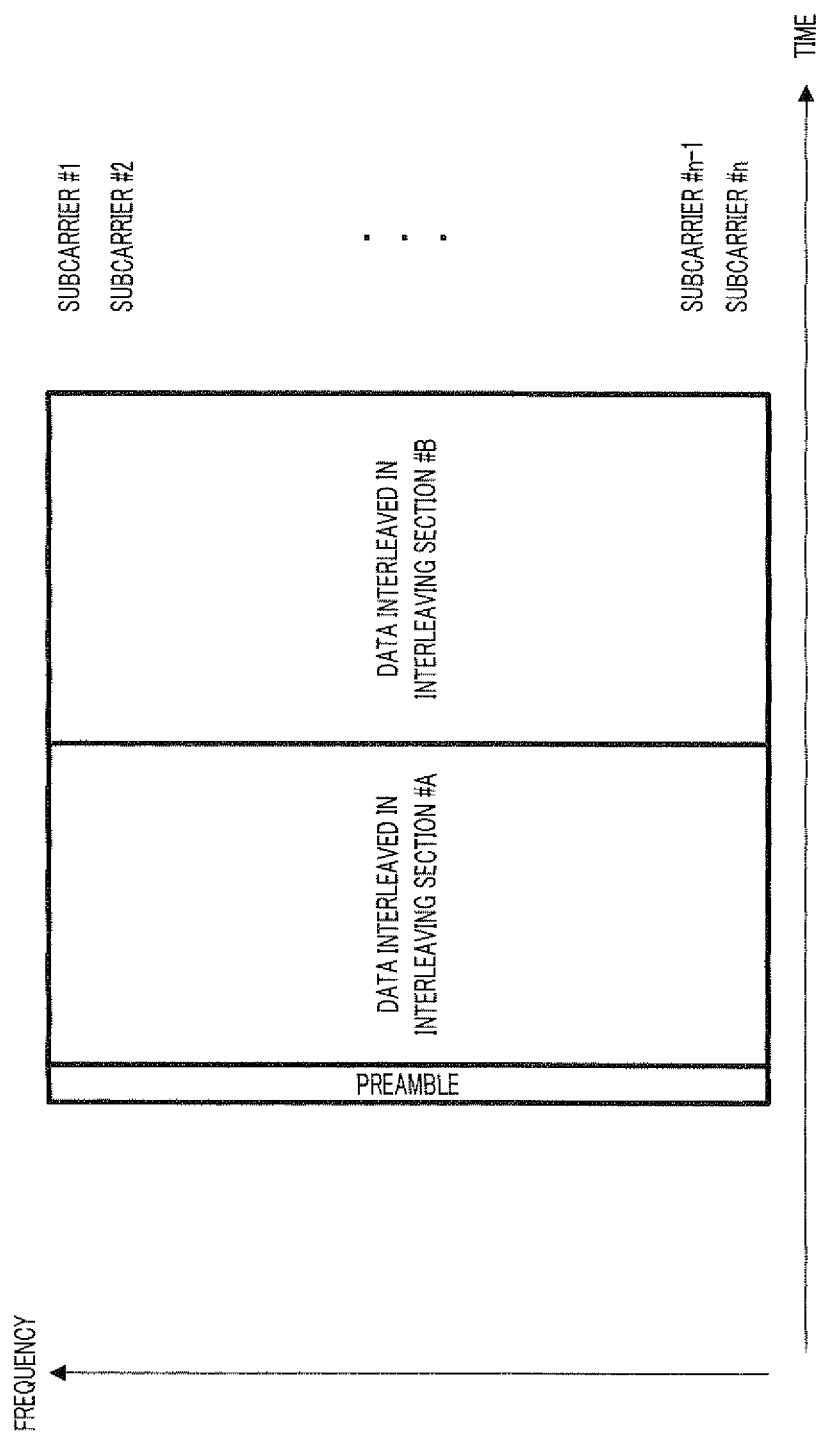
FIG. 12 shows a frame configuration example of a signal that is transmitted from the transmitting apparatus of FIG. 10.
Figure 13:
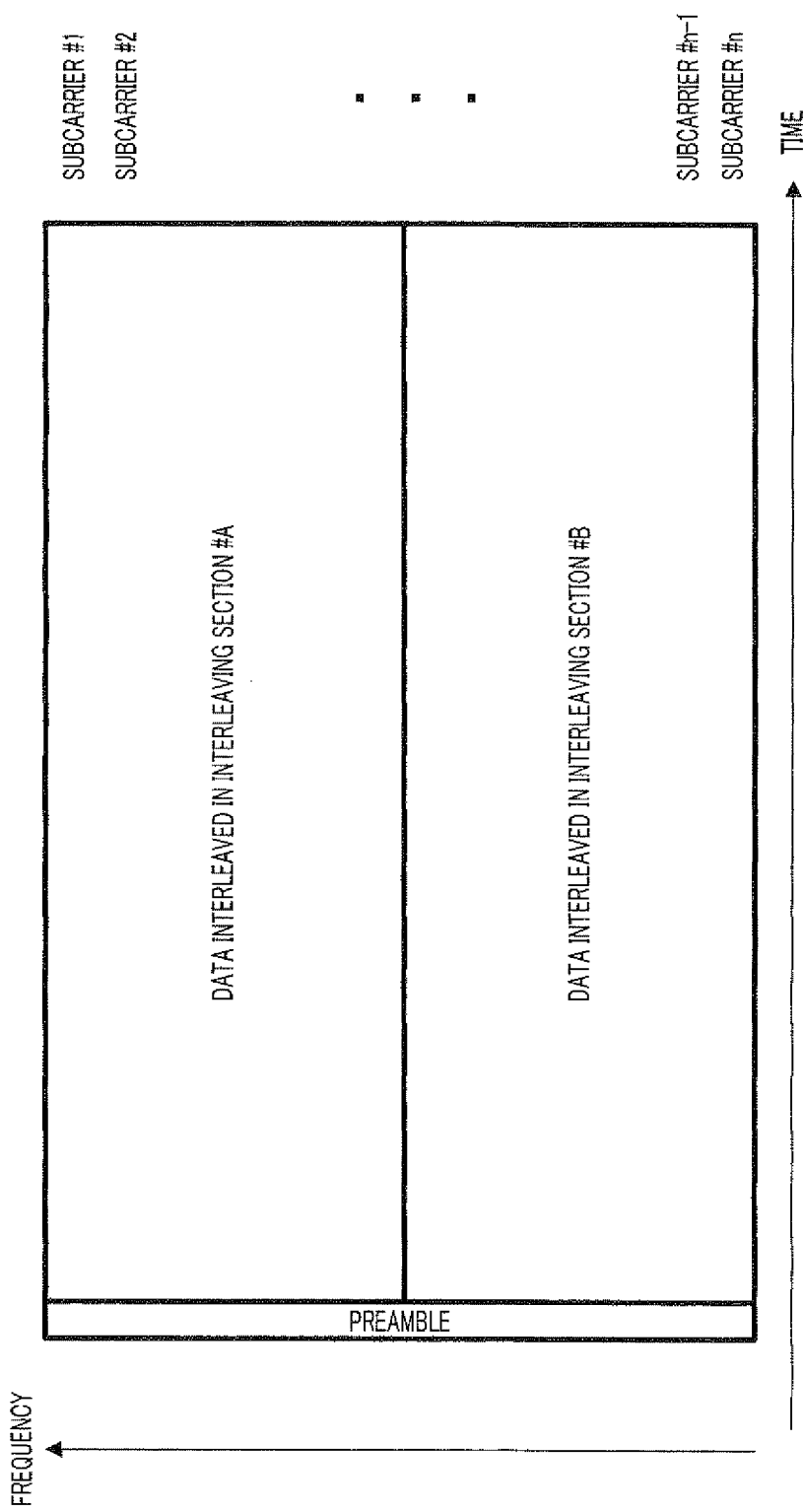
FIG. 13 shows a frame configuration example of a signal that is transmitted from the transmitting apparatus of FIG. 10.

FIG. 12 and FIG. 13 show examples of the frame configuration of a signal that is transmitted from transmitting apparatus 400 in FIG. 10. In FIG. 12 and FIG. 13, the horizontal axis represents time and the vertical axis represents frequency. There are a plurality of subcarriers in the frequency axis direction. Here, assume that there are subcarriers #1 to #n.

Similar to FIG. 7, in FIG. 12, a data group comprised of data interleaved in interleaving section #A and a data group comprised of data interleaved in interleaving section #B, are allocated in group units on the time axis (i.e. these data groups are allocated in different times). In FIG. 12, although data interleaved in interleaving section #A and data interleaved in interleaving section #B are arranged in order, it is naturally possible to arrange these data in the reverse order.

In FIG. 13, a data group comprised of data interleaved in interleaving section #A and a data group comprised of data interleaved in interleaving section #B, are allocated in group units on the frequency axis (i.e. these data groups are allocated in different frequencies). By this means, for example, even in the fading environment where frequency selective fading is caused, there is a low possibility that the data group comprised of data interleaved in interleaving section #A and the data group comprised of data interleaved in interleaving section #B, both have lower received field intensity, and, consequently, one of these data groups has larger received field intensity. As a result, it is possible to always provide log-likelihood ratios of high received field intensity in protographs, and, as a result, acquire received data of good error rate performance on the receiving side.

Here, although the frame configurations in FIG. 12 and FIG. 13 have been described as an example of a transmission frame configuration, the present invention is not limited to this, and an essential requirement is to allocate a data group comprised of data interleaved in interleaving section #A of FIG. 10 and a data group comprised of data interleaved in interleaving section #B of FIG. 10, to different positions in time or frequency in the frame. For example, even if another symbol (such as a data symbol and control symbol) is inserted between a data group comprised of data interleaved in interleaving section #A and a data group comprised of data interleaved in interleaving section #B, it is possible to provide the same effect as above.

Also, although an example case has been described above with the present embodiment where the present invention is applied to single carrier communication and OFDM communication, the present invention is not limited to this, and, even if the present invention is applied to other multicarrier schemes other than the OFDM scheme, it is equally possible to implement the present invention. Also, for example, the present invention is applicable to the spread spectrum communication scheme, the SC-FDMA (Single Carrier Frequency Division Multiple Access) communication scheme, and so on.

Figure 14:
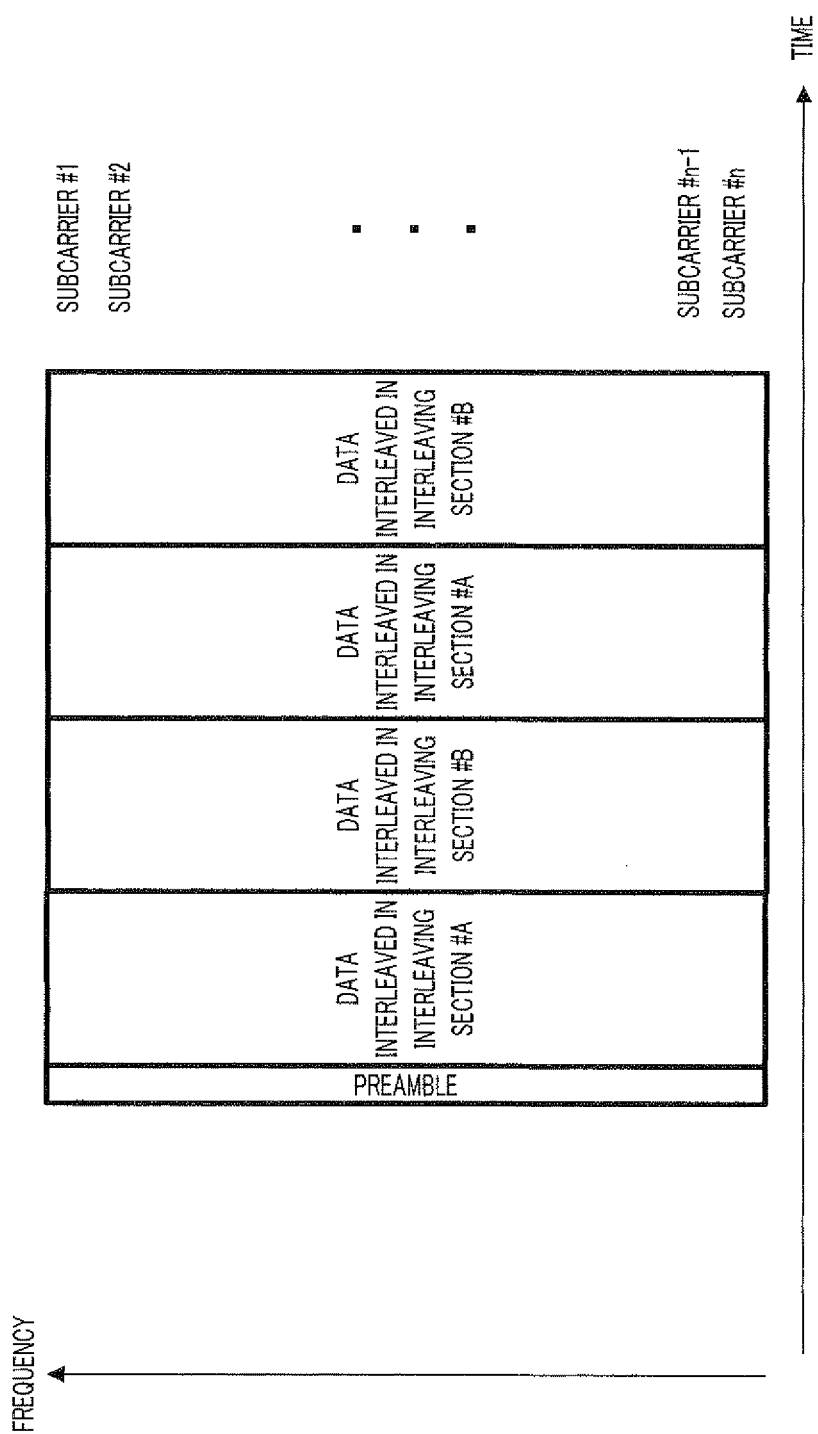
FIG. 14 shows an example of a transmission frame configuration.
Figure 15:
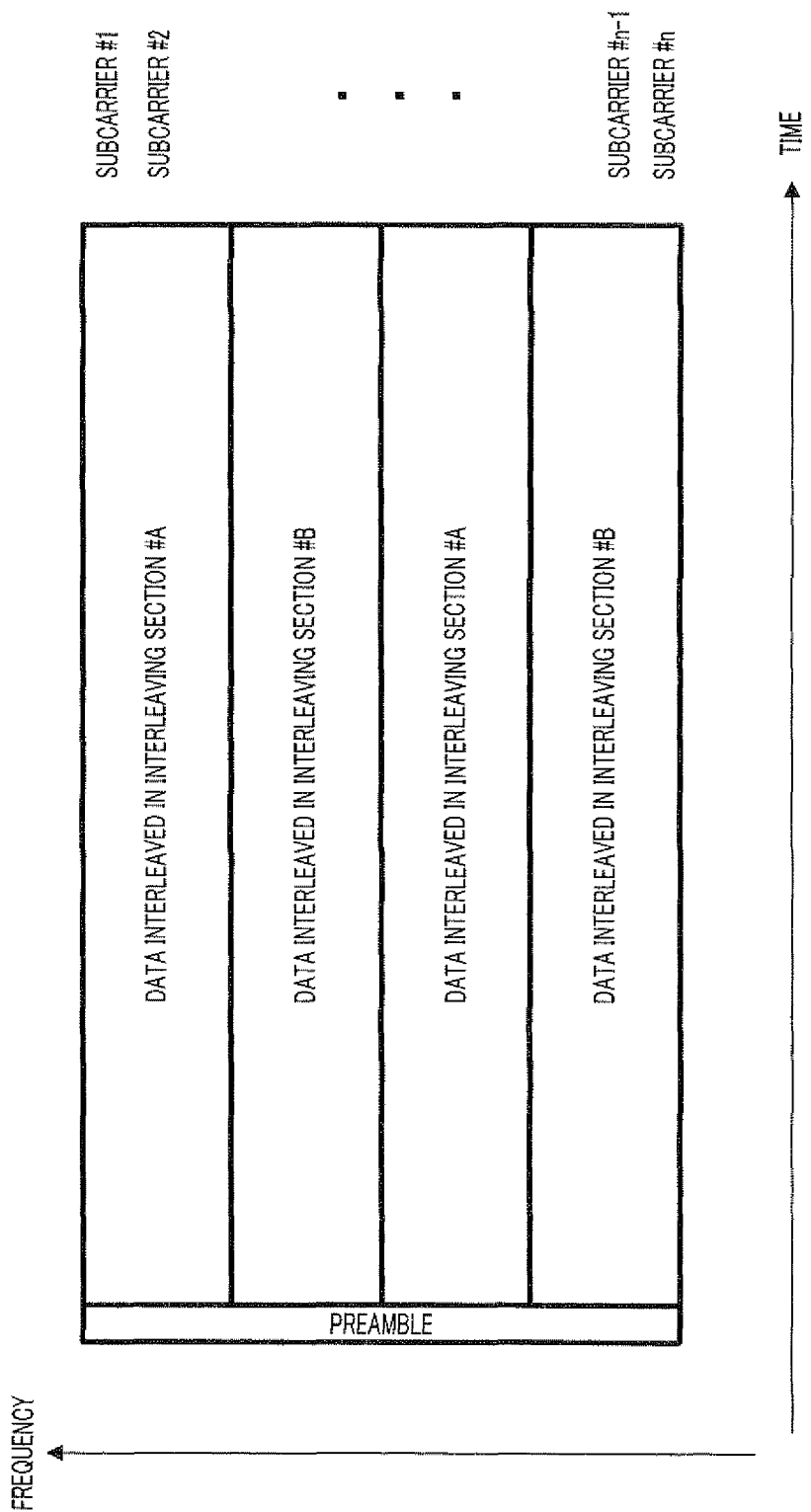
FIG. 15 shows an example of a transmission frame configuration.

Also, as a different frame configuration from those in FIG. 7, FIG. 12 and FIG. 13, the frame configurations in FIG. 14 and FIG. 15 are possible. Here, an essential requirement is to allocate a data group comprised of data interleaved in interleaving section #A and a data group comprised of data interleaved in interleaving section #B such that the influence of fading is alleviated in at least one of these data groups.

In the case of configuring the frames shown in FIG. 14 and FIG. 15, first, a data group comprised of data interleaved in interleaving section #A is split into two, and a data group comprised of data interleaved in interleaving section #B is split into two.

The frame configuration shown in FIG. 14 is made by allocating split data groups in interleaving section #A and split data groups in interleaving section #B alternately in the time domain.

The frame configuration shown in FIG. 15 is made by allocating split data groups in interleaving section #A and split data groups in interleaving section #B alternately in the frequency domain.

Here, it is equally possible to perform different interleaving between interleaving section #A and interleaving section #B.

(Embodiment 2)

Based on feedback information from the communicating party, the present embodiment controls the allocation of significant bits for probability propagation in an LDPC-CC (i.e. an encoded data group corresponding to column numbers where there are "1's" in places outside protographs in an LDPC-CC check matrix) in the frequency domain. An example case will be explained with the present embodiment, using the LDPC-CC shown in FIG. 3 and FIG. 4.

Figure 16:
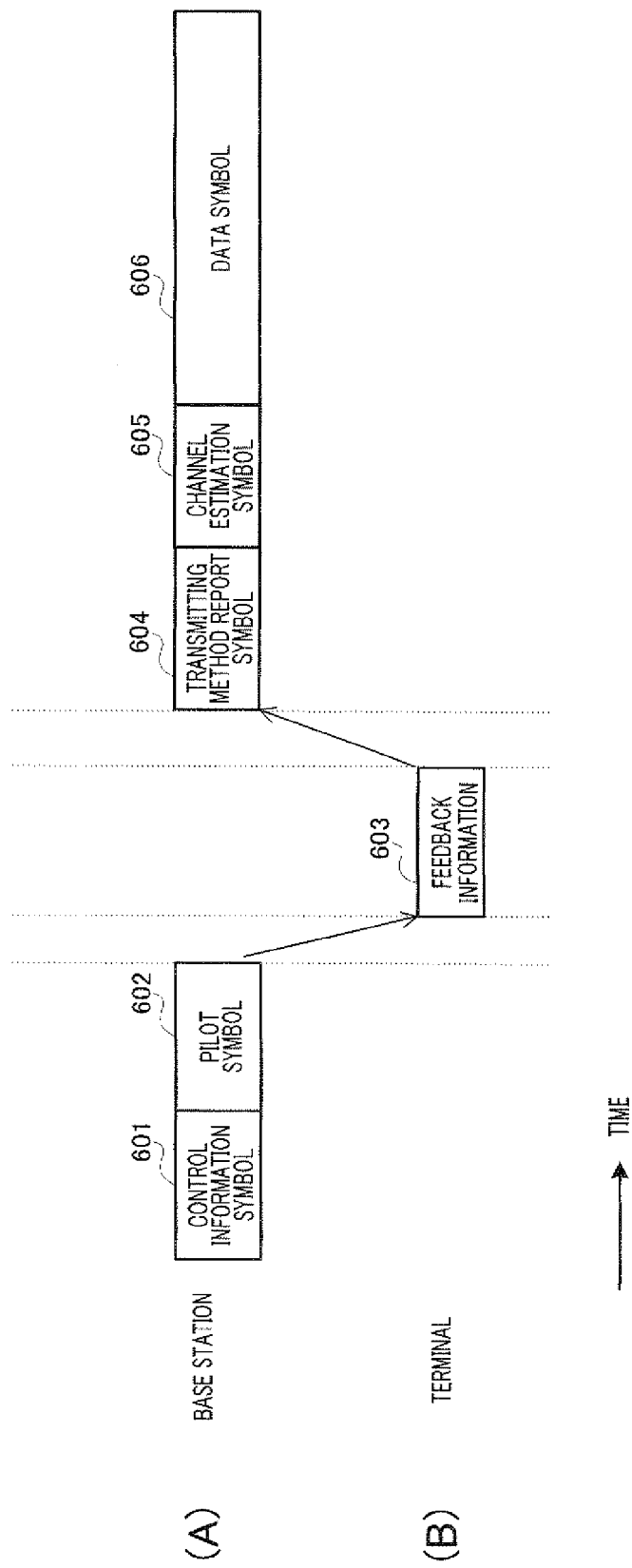
FIG. 16 shows an example of the flow of information on the time axis according to Embodiment 2 of the present invention.

FIG. 16 illustrates an example of the flow of information on the time axis, where a base station transmits data to a terminal. FIG. 16A shows a modulated signal that is transmitted from the base station, in the time axis direction, and FIG. 16B shows a modulated signal that is transmitted from the terminal, in the time axis direction.

The base station transmits control information symbol 601, and the terminal receives this control information symbol 601 and thereby finds, for example, frequency/time synchronization. Next, the base station transmits pilot symbol 602, and the terminal receives this pilot symbol 602 and thereby estimates a propagation environment of radio waves.

Next, the terminal transmits symbol 603 for transmitting feedback information. Specifically, the terminal receives pilot symbol 602 transmitted from the base station, prepares feedback information based on the estimated propagation environment of radio waves, and transmits this information by symbol 603.

Next, the base station transmits transmitting method report symbol 604. Here, based on feedback information symbol 603 transmitted from the terminal, the base station changes the transmitting method of a modulated signal that is transmitted from the base station (i.e. in the present embodiment, the allocation of an encoded data group corresponding to column numbers where there are "1's" in places outside protographs in an LDPC-CC cheek matrix, in the frequency domain or in the time domain). In this case, transmitting method report symbol 604 is the symbol for reporting the changed content to the terminal.

Next, the base station transmits channel estimation symbol 605. The terminal receives this channel estimation symbol, thereby estimating channel variation. Next, the base station transmits data symbol 606.

Figure 17:
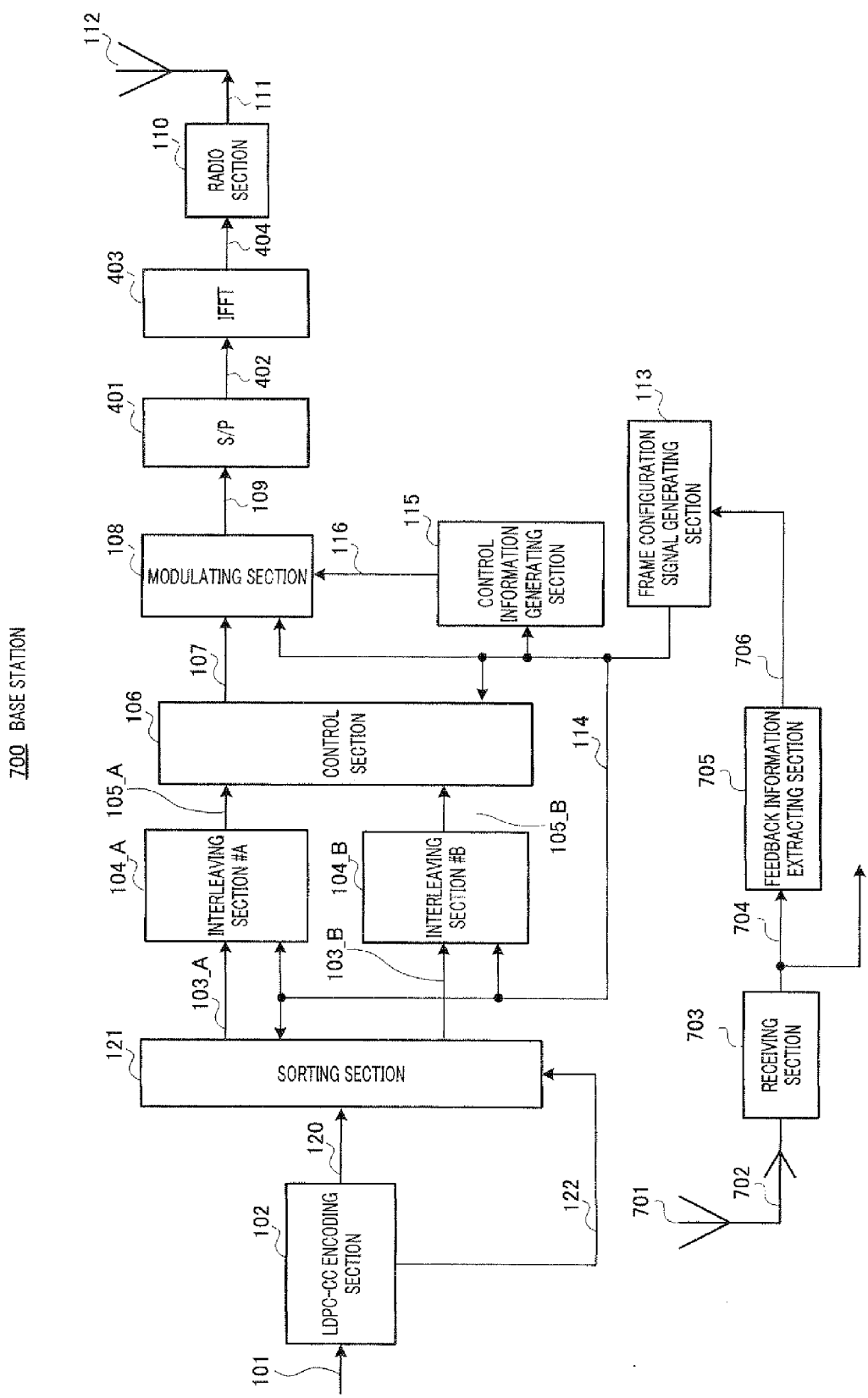
FIG. 17 is a block diagram showing a configuration example of a base station according to Embodiment 2.

FIG. 17, in which the same components as in FIG. 10 are assigned the same reference numerals, shows a configuration example of the base station according to the present embodiment.

In base station 700, receiving section 703 receives as input received data 702 received by receiving antenna 701. Receiving section 703 produces received data 704 by performing predetermined reception processing such as frequency conversion, detection and decoding on received signal 702.

Feedback information extracting section 705 receives as input received data 704, extracts feedback information 706, which is transmitted from the terminal, from received data 704, and outputs this feedback information 706 to frame configuration signal generating section 113.

Frame configuration signal generating section 113 determines a frame configuration based on feedback information 706, and outputs frame configuration signal 114 including information about the determined frame configuration. The method of determining a frame configuration will be described later using FIG. 19 and FIG. 20.

Figure 18:
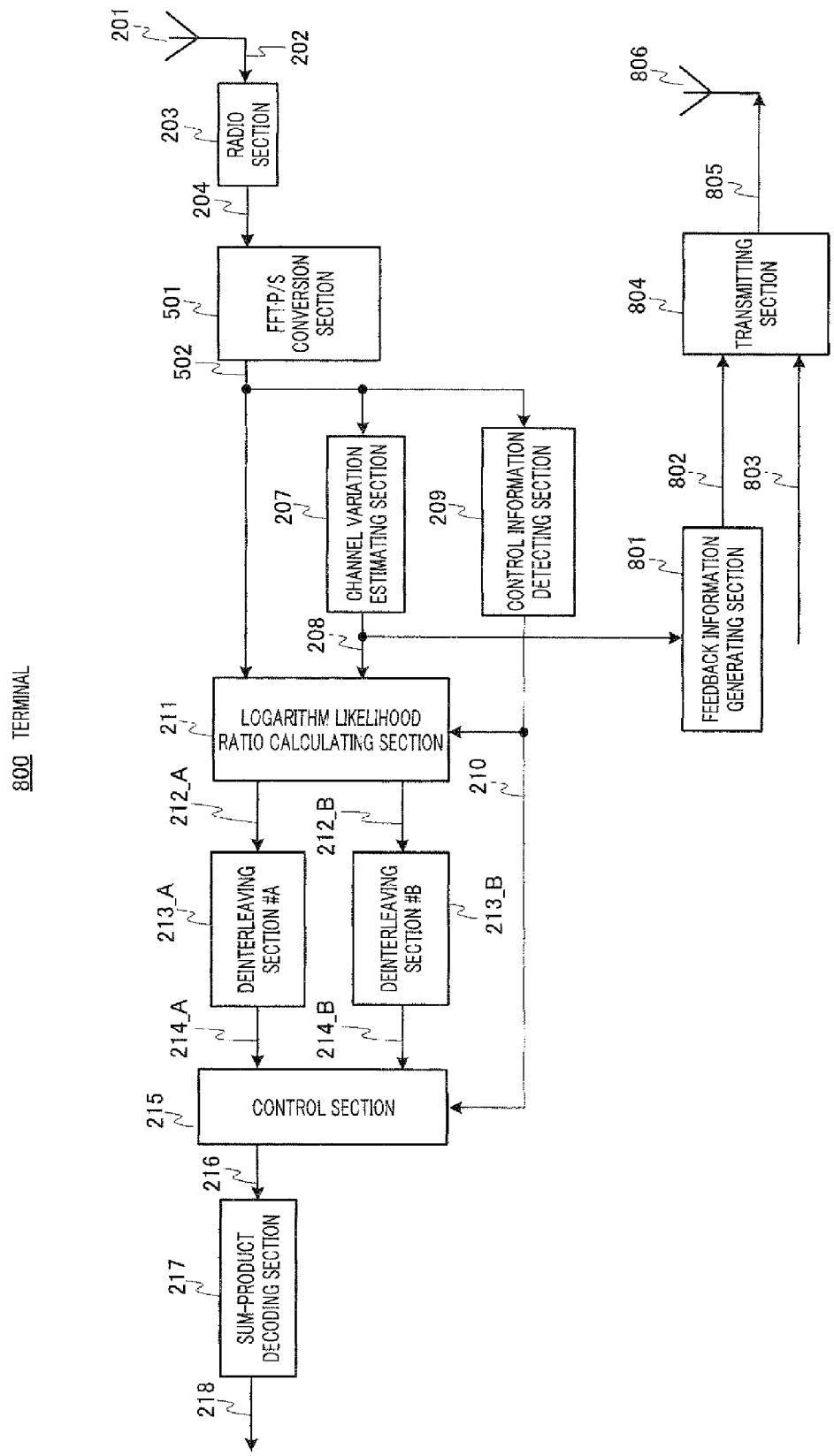
FIG. 18 is a block diagram showing a configuration example of a terminal according to Embodiment 2.

FIG. 18, in which the same components as in FIG. 11 are assigned the same reference numerals, shows a configuration example of the terminal according to the present embodiment.

In terminal 800, feedback information generating section 801 receives as input channel variation estimation signal 208. Feedback information generating section 801 prepares and outputs feedback information 802 based on channel variation estimation signal 208 to transmitting section 804. Transmitting section 804 receives as input feedback information 802 and transmission digital data 803, and produces transmission signal 805 by generating a modulated signal based on the frame configuration and performing predetermined radio processing such as frequency conversion and amplification on this modulated signal. Transmission signal 805 is outputted from antenna 806 as a radio wave.

Here, although the method of generating feedback information (such as CSI (Channel State Information)) in feedback information generating section 801 does not affect the present invention, examples include the following methods: a method of quantizing channel variation estimation signal 208 and feeding back the quantized channel estimation signal and a method of preparing compressed channel estimation signal information from channel variation estimation signal 208 and feeding back this information, where the transmitting method is determined in the base station; and a method of preparing information about the control method (transmitting method) that is requested to the communicating party, from channel variation estimation signal 208, and feeding back this information, where the transmitting method is determined in the terminal.

Next, a specific example will be explained where significant bits for probability propagation in an LDPC-CC (i.e. an encoded data group corresponding to column numbers where there are "1's" in places outside protographs in an LDPC-CC) are allocated based on feedback information from a terminal.

Figure 19:
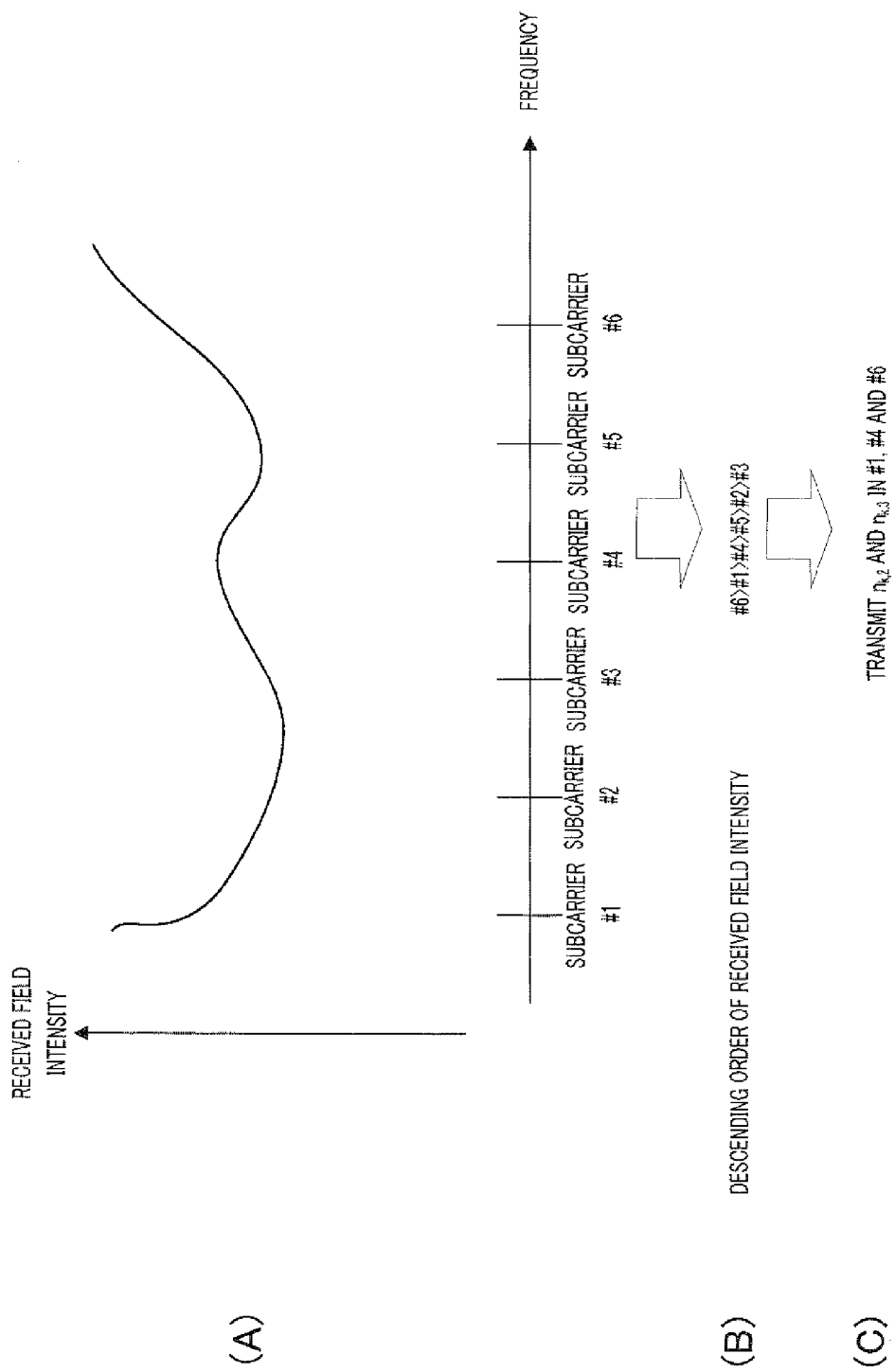
FIG. 19 illustrates a method of allocating significant bits to subcarriers.

FIG. 19 shows an example of the method of allocating significant bits to subcarriers. FIG. 19A shows a characteristic curve for estimated channel variation, where the horizontal axis represents frequency and the vertical axis represents received field intensity. Further, the characteristic curve shown in FIG. 19 is prepared based on channel variation estimation signal 208 from terminal 800 in FIG. 18. Here, FIG. 19 illustrates an example where the terminal receives an OFDM symbol comprised of six subcarriers.

As shown in FIG. 19B, assume that, in the case of arranging the field intensity of subcarriers in ascending order, field intensity increases in the order from subcarrier #3, subcarrier #2, subcarrier #5, subcarrier #4, subcarrier #1 and subcarrier #6.

In this case, in order to protect significant bits for probability propagation, $n_{k,2}$ and $n_{k,3}$ (k=1, 2, 3, 4, 5, ...), in the LDPC-CC shown in FIG. 3, as shown in FIG. 19C, these significant bits are allocated to subcarriers #1, #4 and #6 of high received field intensity upon reception in the terminal. As described above, the base station, which is the transmitting side of significant bits, or the terminal, which is the receiving side of significant bits, may determine to which subcarriers the significant bits are allocated.

Thus, by transmitting significant bits for probability propagation, $n_{k,2}$ and $n_{k,3}$ (k=1, 2, 3, 4, 5, ...), using subcarriers of high received field intensity (i.e. good received quality), it is possible to provide an effect of improving error rate performance of received data acquired by decoding in a terminal.

Although a case has been described above with the example shown in FIG. 19C, where significant bits for probability propagation, $n_{k,2}$ and $n_{k,3}$ (k=1, 2, 3, 4, 5, ...), are allocated to three subcarriers #1, #4 and #6, the present invention is not limited to this, and an important point is to transmit significant bits for probability propagation, $n_{k,2}$ and $n_{k,3}$ (k=1, 2, 3, 4, 5, ...), using subcarriers of good received quality preferentially.

Such data allocation control is performed in control section 106 of the base station in FIG. 17.

Figure 20:
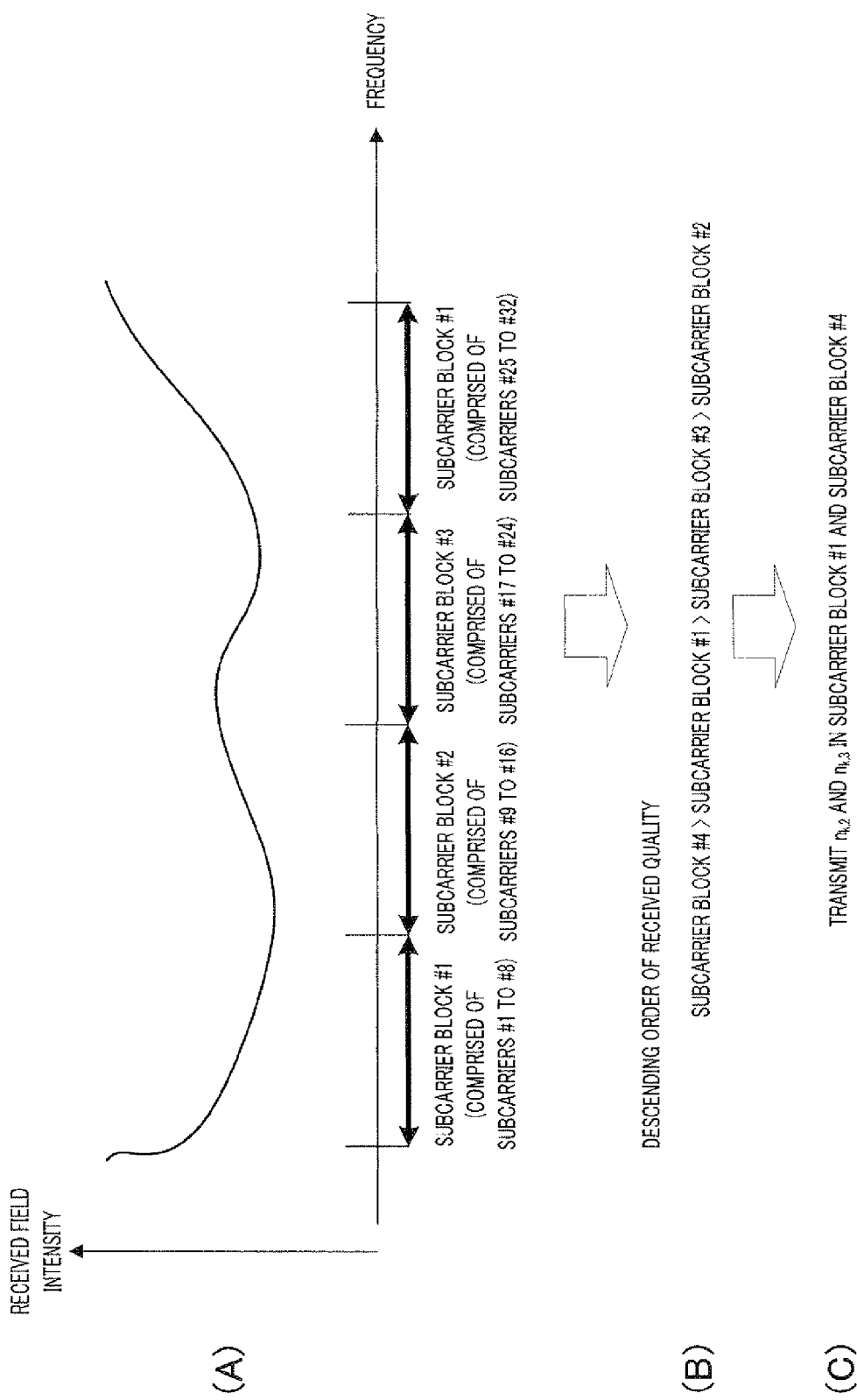
FIG. 20 illustrates a method of allocating significant bits to subcarrier blocks.

FIG. 20 shows the method of allocating significant bits for probability propagation, $n_{k,2}$ and $n_{k,3}$ (k=1, 2, 3, 4, 5, ...), to subcarriers, as a different example from the method shown in FIG. 19. A feature of FIG. 20 lies in that the allocation method is simplified compared to that of FIG. 19. The allocation method of FIG. 20 is effective especially when there is a large number of subcarriers for use.

According to the method shown in FIG. 20, first, a plurality of subcarriers are grouped to form a subcarrier block. For example, as shown in FIG. 20A, the subcarrier block comprised of subcarriers #1 to #8 is referred to as "subcarrier block #1." Similarly, the subcarrier block comprised of subcarriers #9 to #16 is referred to as "subcarrier block #2," the subcarrier block comprised of subcarriers #17 to #24 is referred to as "subcarrier block #3," and the subcarrier block comprised of subcarriers #25 to #32 is referred to as "subcarrier block #4."

FIG. 20A shows a characteristic curve for estimated channel variation, where the horizontal axis represents frequency and the vertical axis represents received field intensity. Also, as shown in FIG. 20B, the magnitudes of received quality in subcarrier block units are compared. Here, for example, in the case of arranging subcarrier blocks in ascending order of received quality, assume that subcarrier block #2, subcarrier block #3, subcarrier block #1 and subcarrier block #4 are provided in order.

In this case, to protect significant bits for probability propagation, $n_{k,2}$ and $n_{k,3}$ (k=1, 2, 3, 4, 5, ...), in the LDPC-CC shown in FIG. 3, as shown in FIG. 20C, these significant bits are allocated to subcarrier blocks #1 and #4 of high received field intensity upon reception in the terminal.

Although a case has been described above with the example shown in FIG. 20C, where significant bits for probability propagation, $n_{k,2}$ and $n_{k,3}$ (k=1, 2, 3, 4, 5, ...), are allocated to two subcarrier blocks #1 and #4, the present invention is not limited to this, and an important point is to transmit significant bits for probability propagation, $n_{k,2}$ and $n_{k,3}$ (k=1, 2, 3, 4, 5, ...), using subcarrier blocks of good received quality preferentially.

Here, in the case of allocating significant bits for probability propagation, $n_{k,2}$ and $n_{k,3}$ (k=1, 2, 3, 4, 5, ...), in subcarrier block units as shown in FIG. 20, compared to the case where bits are allocated in subcarrier units as shown in FIG. 19, it is possible to provide an advantage of reducing the amount of calculations required to perform rearrangement in ascending order of received quality.

As described above, based on feedback information from the communicating party, the present embodiment controls the allocation of significant bits for probability propagation in an LDPC-CC (i.e. an encoded data group corresponding to column numbers where there are "1's" in places outside protographs in an LDPC-CC check matrix) in the frequency domain, so that the receiving side can produce received data of good error rate performance.

Also, although an example ease has been described above with the present embodiment where interleaving is performed, according to the present embodiment, it is possible to improve the error rate performance of received data without performing interleaving.

Also, although an example case has been described with the present embodiment where the present invention is applied to OFDM communication, the present invention is not limited to this, and, even when the present invention is applied to other multicarrier communication than OFDM communication, it is equally possible to implement the present invention Also, like OFDMA (Orthogonal Frequency Division Multiple Access) shown in Non-Patent Document 6, even if the present invention is applied to a communication scheme where the communicating party (i.e. terminal) varies per subcarrier (or subcarrier block), by allocating data to the same subcarriers (or subcarrier blocks) as above on a per communicating party basis, it is possible to provide the same effect as in the above embodiments.

Further, even if the present invention is applied to the MIMO (Multiple-Input Multiple-Output) communication scheme shown in Non-Patent Document 7, it is effective to adopt the method of, based on feedback information from the communicating party, determining allocation of symbols for propagating important data for probability propagation in an LDPC-CC, so that it is possible to implement the present invention in the same way as in the above-described examples. In this case, the number of streams to be transmitted increases in MIMO transmission, and, consequently, it is preferable that the base station determines to which streams and subcarriers the symbols for propagating important data for probability propagation in an LDPC-CC are allocated.

(Embodiment 3)

The retransmission method will be explained with the present embodiment, where it is possible to improve the error rate performance of received data efficiently in the case of using an LDPC-CC. In the present embodiment, an example case will be explained using the LDPC-CC of FIG. 3 and FIG. 4 explained in Embodiment 1.

Figure 21:
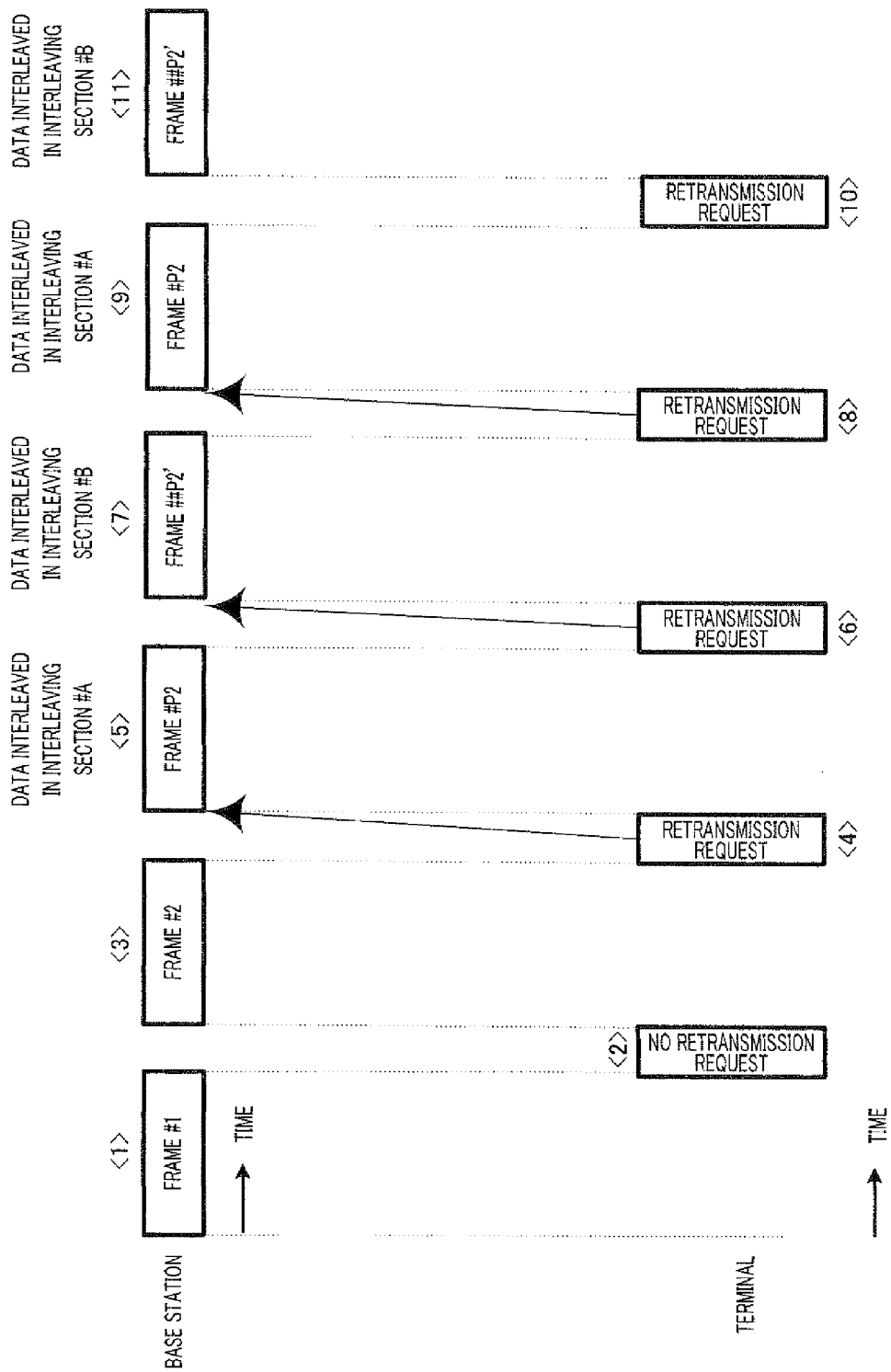
FIG. 21 shows a data flow between a base station and a terminal according to Embodiment 3.

FIG. 21 shows an example of data flow between the base station and terminal according to the present embodiment. This flow is as follows.

<1>: The base station transmits frame #1 including data to the terminal. In this case, the data represents data encoded by the LDPC-CC explained in Embodiment 1.

<2>: The terminal receives frame #1 and reports to the base station that retransmission is not necessary, because the decoding result includes no error.

<3>: The base station has not received a "retransmission request" from the terminal, and therefore transmits frame #2 including data to the terminal. In this case, the data represents data encoded by the LDPC-CC explained in Embodiment 1.

<4>: The terminal receives frame #2 and requests retransmission to the base station, because the decoding result includes error.

<5>: The base station has received a "retransmission request" from the terminal, and therefore transmits frame #P2, which is partial data of frame #2, to the terminal.

<6>: The terminal receives frame #P2 and requests retransmission to the base station, because the decoding result includes error.

<7>: The base station has received a "retransmission request" from the terminal, and therefore transmits frame #P2', which is partial data P2' of frame #2 (different from frame #P2), to the terminal.

<8>: The terminal receives frame #P2' and requests retransmission to the base station because the decoding result includes error.

<9>: The base station has received a "retransmission request" from the terminal, and therefore transmits frame #P2, which is partial data of frame #2, to the terminal.

<10>: The terminal receives frame #P2 and requests retransmission, because the decoding result includes error.

<11>: The base station has received a "retransmission request" from the terminal, and therefore transmits frame #2', which is partial data of frame #2, to the terminal.

Figure 22:
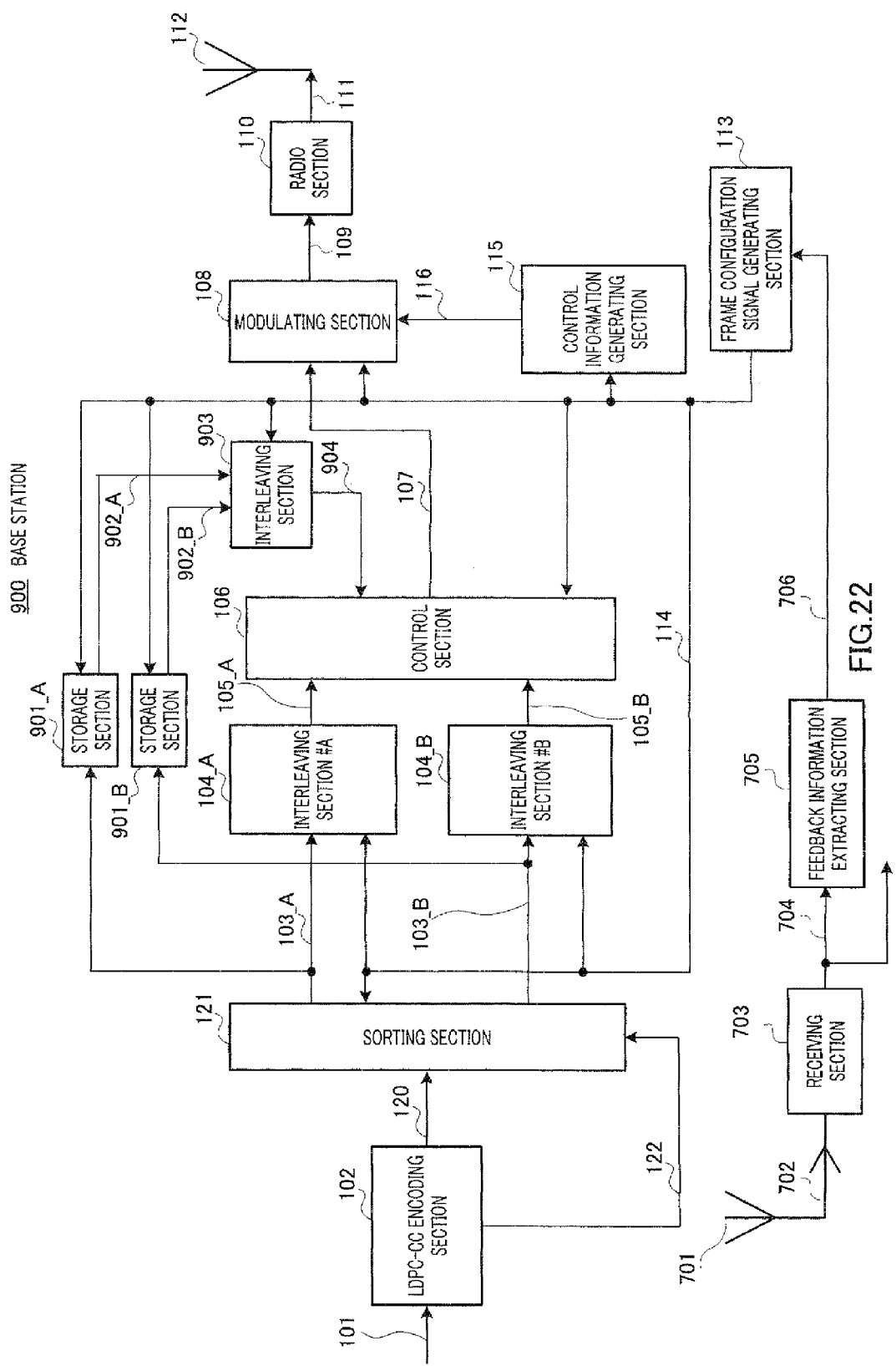
FIG. 22 is a block diagram showing a configuration example of a base station according to Embodiment 3.

FIG. 22, in which the same components as in FIG. 17 are assigned the same reference numerals, shows a configuration example of the base station according to the present embodiment.

In base station 900, frame configuration signal generating section 113 receives as input feedback information 706. Frame configuration signal generating section 113 acquires information as to whether or not transmitted data includes error, where the information is included in feedback information 706 and transmitted from the terminal, identifies whether or not to retransmit data based on this information, and outputs frame configuration signal 114 including this identification result.

Storage section 901_A stores encoded data #A (103_A). Further, based on frame configuration signal 114, storage section 901_A outputs stored, encoded data #A (902_A) upon retransmission.

Similarly, storage section 901_B stores encoded data #B (103_B). Further, based on frame configuration signal 114, storage section 901_B outputs stored, encoded data #B (902_B) upon retransmission.

Interleaving section 903 receives as input retransmission encoded data #A (902_A), retransmission encoded data #B (902_B) and frame configuration signal 114, and, when frame configuration signal 114 indicates a retransmission, interleaves one of retransmission encoded data #A (902_A) and retransmission encoded data #B (902_B), and outputs interleaved data 904.

Next, the operations of storage section 901_A and storage section 901_B will be explained in detail with reference to FIG. 21.

In FIG. 21, with frame #P2, which is the first retransmission data, data corresponding to significant bits for probability propagation, $n_{k,2}$ and $n_{k,3}$ (k=1, 2, 3, 4, 5, . . . ), in the LDPC-CC described in FIG. 3 and FIG. 4 (i.e. retransmission encoded data #A (902_A)), is transmitted among data subjected to LDPC-CC coding and transmitted in frame #2 of FIG. 21.

Thus, by preferentially retransmitting significant bits for probability propagation, $n_{k,1}$ and $n_{k,3}$ (k=1, 2, 3, 4, 5, . . . ), it is possible to reduce the number of retransmissions and suppress the amount of data to be retransmitted, so that it is possible to improve data transmission efficiency in a system.

In FIG. 21, with frame #2P', which is second retransmission data, data corresponding to bits other than significant bits for probability propagation in the LDPC-CC described in FIG. 3 and FIG. 4, that is, data corresponding to bits, $n_{k,1}$ and $n_{k,4}$ (k=1, 2, 3, 4, 5, . . . ) (i.e. retransmission encoded data #B (902_B)), is transmitted among data subjected to LDPC-CC coding and transmitted in frame #2 of FIG. 21.

By this means, upon the second retransmission, it is possible to reduce the possibility that error is caused.

In the example shown in FIG. 21, the same data as in the first retransmission (i.e. $n_{k,2}$ and $n_{k,3}$ (k=1, 2, 3, 4, 5, . . . )) is retransmitted upon the third retransmission, and the same data as in the second retransmission (i.e. $n_{k,1}$ and $n_{k,4}$ (k=1, 2, 3, 4, 5, . . . )) is retransmitted upon the fourth retransmission.

Therefore, interleaving section 903 in FIG. 22 interleaves retransmission encoded data #A (902_A) upon the first and third retransmissions, interleaves retransmission encoded data #B (902_B) upon the second and fourth retransmissions, and outputs the result as interleaved data 904.

Control section 106 receives as input interleaved data #A (105_A), interleaved data #B (105_B), interleaved data 904 and frame configuration signal 114, and, if frame configuration signal 114 indicates a retransmission, outputs interleaved data 904 as transmission data 107. By contrast, if frame configuration signal 114 does not indicate a retransmission, the operations of control section 106 are the same as in Embodiment 1.

Figure 23:
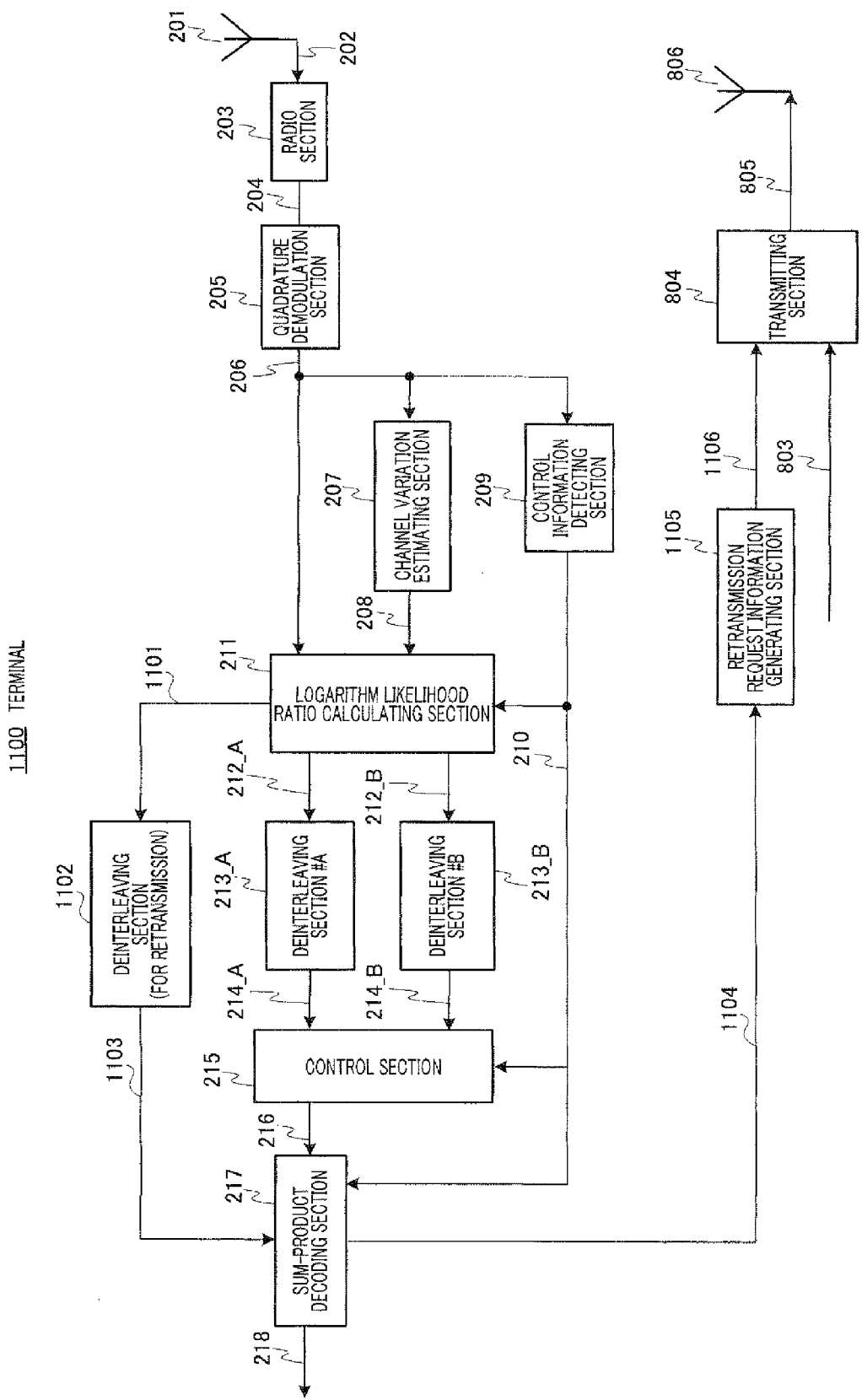
FIG. 23 is a block diagram showing a configuration example of a terminal according to Embodiment 3.

FIG. 23, in which the same components as in FIG. 18 are assigned the same reference numerals, shows a configuration example of the terminal according to the present embodiment.

In terminal 1100, control information detecting section 209 receives as input baseband signal 206. Control information detecting section 209 detects, from baseband signal 206, the symbol indicating the type of frame data transmitted from the base station, identifies, based on that symbol, whether or not data transmitted from the base station is retransmission data and the number of retransmissions, and outputs control signal 210 including this identification result.

Log-likelihood ratio calculating section 211 receives as input baseband signal 206, channel variation estimation signal 208 and control signal 210, and, if control signal 210 does not indicate retransmission data, outputs log-likelihood ratio signal #A (212_A) and log-likelihood ratio calculating section #B (212_B) in the same way as in Embodiment 1. By contrast, if control signal 210 indicates retransmission data, log-likelihood ratio calculating section 211 outputs log-likelihood ratio signal 1101 for retransmission to deinterleaving section 1102.

Deinterleaving section 1102 is used for retransmission, and performs deinterleaving processing opposite to the interleaving processing in interleaving section 903 of base station 900, on log-likelihood ratio signal 1101 for retransmission, and inputs deinterleaved log-likelihood ratio signal 1103 for retransmission.

Sum-product decoding section 217 receives as input rearranged log-likelihood ratio 216, deinterleaved log-likelihood signal 1103 for retransmission and control signal 210. Further, if control signal 210 does not indicate retransmission data, sum-product decoding section 217 produces received data 218 by performing sum-product decoding using rearranged log-likelihood ratio 216, and produces decision signal 1104 by deciding whether or not decoded data includes error. By contrast, if control signal 210 does not indicate that the data is retransmission data, sum-product decoding section 217 produces received data 218 by performing sum-product decoding using rearranged log-likelihood ratio 216 and deinterleaved log-likelihood ratio signal 1103 that are received as input in advance, and produces decision signal 1104 by deciding whether or not the decoded data includes error.

Retransmission request information generating section 1105 receives as input decision signal 1104, generates retransmission request information 1106 indicating to request a retransmission when received data includes error or indicating not to request a retransmission if received data does not include error, and outputs retransmission request information 1106 to transmitting section 804.

Transmitting section 804 receives as input retransmission request information 1106 and transmission digital data 803, and produces transmission signal 805 by generating a modulated signal based on the frame configuration and performing predetermined radio processing such as frequency conversion and amplification on this modulated signal.

Figure 24:
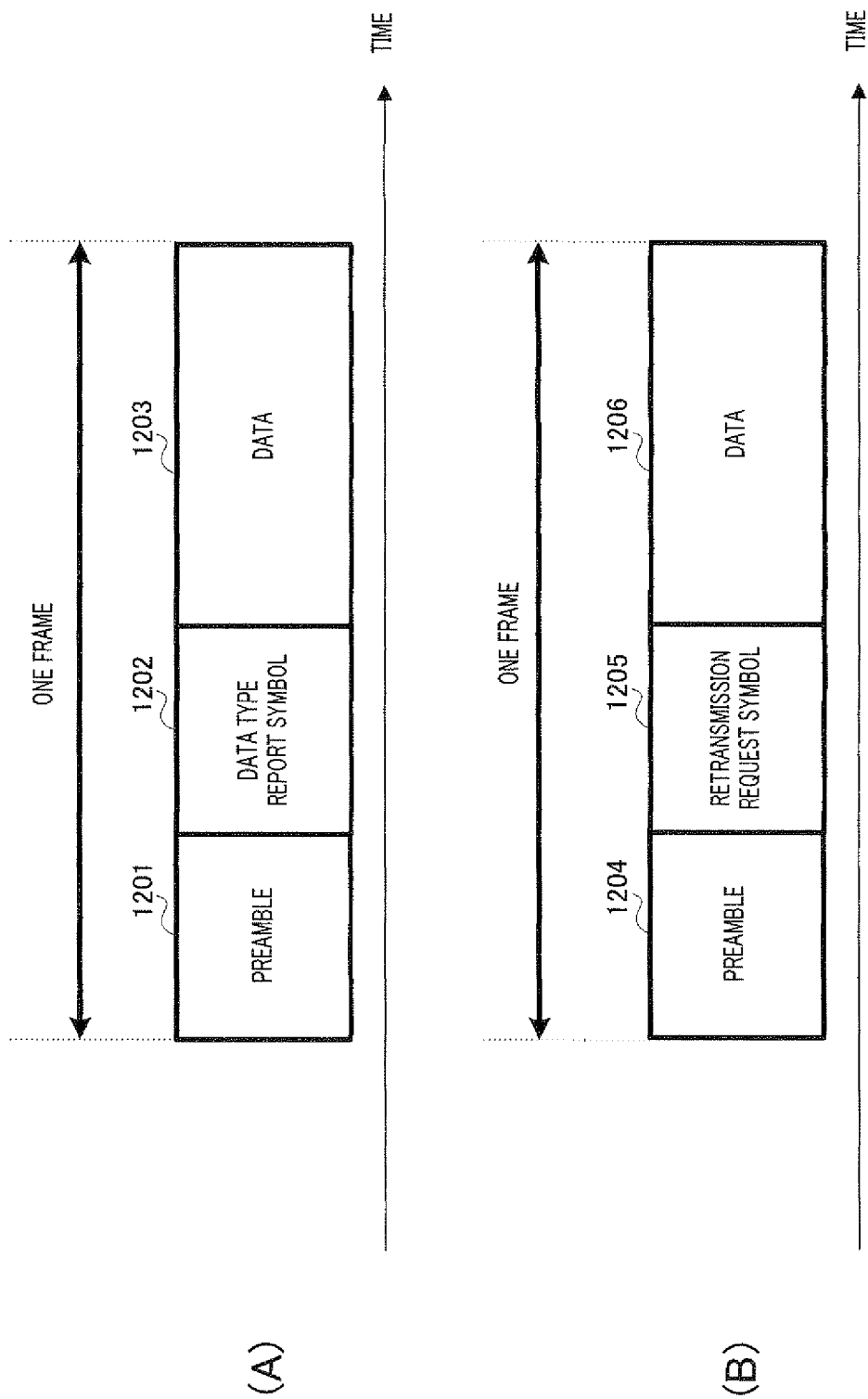
FIG. 24A shows an example of a transmission frame configuration in a base station and FIG. 24B shows an example of a transmission frame configuration in a terminal.

FIG. 24 shows the frame configuration of a transmission signal from the base station on the time axis (FIG. 24A) and the frame configuration of a transmission signal from the terminal (FIG. 24B). Preambles 1201 and 1204 are the symbols for allowing the communicating party to estimate channel variation. Data type report symbol 1202 is the symbol for reporting whether or not transmission data 1203 is retransmission data and the number of retransmissions, to the communicating party (i.e. terminal).

Retransmission request symbol 1205 is the symbol for requesting a retransmission to the communicating party (i.e. base station). Data symbol 1206 is the symbol for transmitting data.

As described above, according to the present embodiment, by preferentially retransmitting significant bits for probability propagation, $n_{k,2}$ and $n_{k,3}$ (k=1, 2, 3, 4, 5, ...), in an LDPC-CC, it is possible to transmit error-free data to the communicating party with a fewer number of retransmissions, so that it is possible to improve data transmission efficiency in a system.

Figure 25:
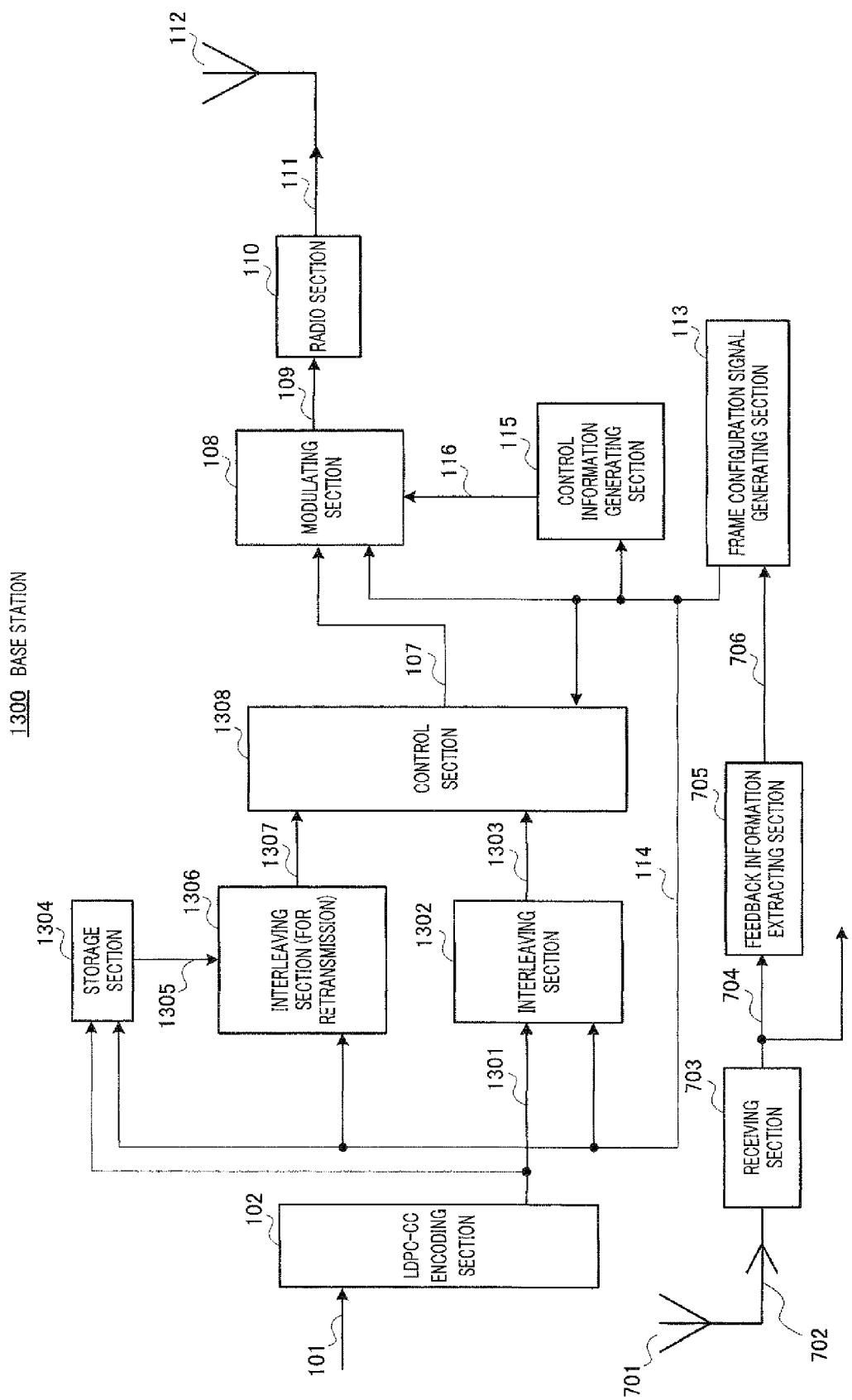
FIG. 25 is a block diagram showing a configuration example of a base station according to Embodiment 3.
Figure 26:
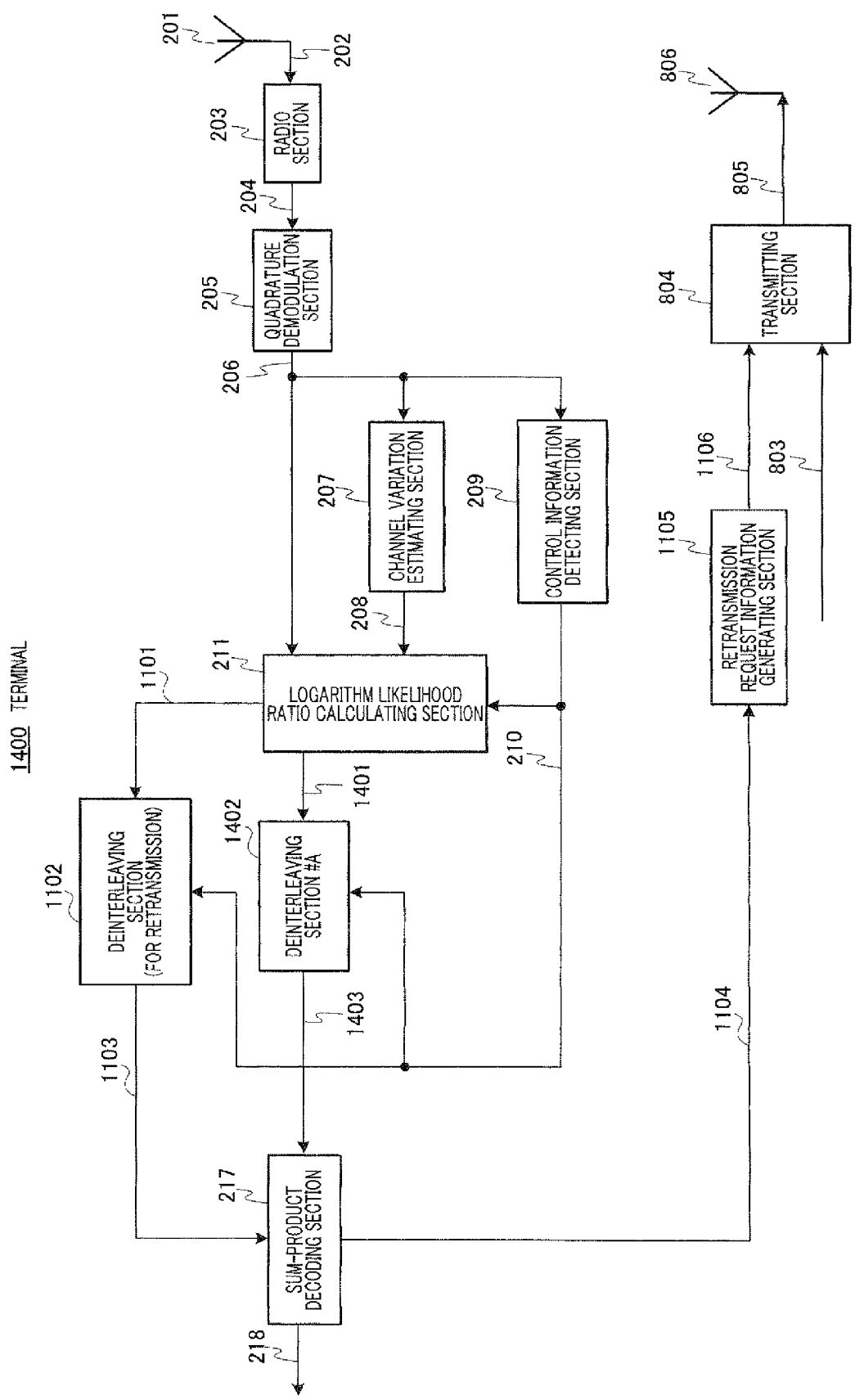
FIG. 26 is a block diagram showing a configuration example of a terminal according to Embodiment 3.

Next, the configurations of the base station and the terminal shown in FIG. 22 and FIG. 23, are shown in FIG. 25 and FIG. 26, respectively. The configurations of FIG. 25 and FIG. 26 differ from those of FIG. 22 and FIG. 23 in that, in the case of not retransmission data, interleaving of significant bits for probability propagation $n_{k,2}$ and $n_{k,3}$ (k=1, 2, 3, 4, 5, ...), is not distinguished from interleaving of the rest of the bits, $n_{k,1}$ and $n_{k,4}$ (k=1, 2, 3, 4, 5, ...).

In base station 1300 of FIG. 25 in which the same components as in FIG. 17 are assigned the same reference numerals, LDPC-CC encoding section 102 outputs encoded data 1301, which is acquired by coding using an LDPC-CC, to interleaving section 1302, storage section 1304 and interleaving section (for retransmission) 1306.

Interleaving section 1302 receives as input encoded data 1301 and frame configuration signal 114, and, if frame configuration signal 114 does not indicate a retransmission, interleaves encoded data 1301 and outputs interleaved data 1303 to control section 1308.

Storage section 1304 receives as input encoded data 1301 and frame configuration signal 114, and, if frame configuration signal 114 does not indicate a retransmission, stores encoded data 1301 received as input. By contrast, if frame configuration signal 114 indicates a retransmission and an odd number of retransmissions such as one and three, storage section 1304 outputs significant bits for probability propagation $n_{k,2}$ and $n_{k,3}$ (k=1, 2, 3, 4, 5, ...). Also, if frame configuration signal 114 indicates an even number of retransmissions such as two and four, storage section outputs bits, $n_{k,1}$ and $n_{k,4}$ (k=1, 2, 3, 4, 5, ...).

Interleaving section 1306 is the interleaver for retransmission data, and receives as input retransmission encoded data 1307 and frame configuration signal 114, interleaves retransmission encoded data 1305 and outputs interleaved retransmission encoded data 1307 to control section 1308.

Control section 1308 receives as input interleaved encoded data 1303, interleaved retransmission encoded data 1307 and frame configuration signal 114, and, if frame configuration signal does not indicate a retransmission, selects and outputs interleaved encoded data 1303. By contrast, if frame configuration signal 114 indicates a retransmission, control section 1308 selects and outputs interleaved retransmission encoded data 1307.

FIG. 26, in which the same components as in FIG. 23 are assigned the same reference numerals, shows a configuration example of a terminal that communicates with base station 1300 of FIG. 25. In terminal 1400, log-likelihood ratio calculating section 211 receives as input baseband signal 206 and control signal 210, and, if control signal 210 does not indicate a retransmission, outputs calculated log-likelihood ratio 1401 to deinterleaving section 1402. By contrast, if control signal 210 indicates a retransmission, log-likelihood ratio calculating section 211 outputs calculated log-likelihood ratio 1101 to deinterleaving section (for retransmission) 1102.

Deinterleaving section 1402 receives as input log-likelihood ratio 1401 and control signal 210, and, if control signal 210 does not indicate a retransmission, deinterleaves log-likelihood ratio 1401 and outputs deinterleaved log-likelihood ratio 1403.

Sum-produce decoding section 217 receives as input deinterleaved log-likelihood ratio 1403, deinterleaved log-likelihood ratio for retransmission 1103 and control signal 210. Further, if control signal 210 does not indicate retransmission data, sum-product decoding section 217 produces received data 218 by performing sum-product decoding using deinterleaved log-likelihood ratio 1403, and produces decision signal 1104 by deciding whether or not the decoded data includes error. By contrast, if control signal 210 indicates retransmission data, sum-product decoding section 217 produces received data 218 by performing sum-product decoding using deinterleaved log-likelihood ratio 1403 and deinterleaved log-likelihood ratio signal for retransmission 1103 that are received as input in advance, and produces decision signal 1104 by deciding whether or not the decoded data includes error.

In the present embodiment, an important point is to preferentially retransmit significant bits for probability propagation, $n_{k,2}$ and $n_{k,3}$ (k=1, 2, 3, 4, 5, ... ), in an LDPC-CC. Therefore, data transmitting methods except upon retransmission do not affect the effects of the retransmission method of the present embodiment. Also, the method upon a second or subsequent retransmission is not limited to the above embodiment.

Also although an example case has been described above with the present embodiment where the present invention is applied to single-carrier communication, the present invention is not limited to this, and, even if the present invention is applied to multicarrier communication such as OFDM communication, it is equally possible to implement the present invention. Further, it is equally possible to apply the present invention to, for example, the spread spectrum communication scheme and the SC-FDMA communication scheme. Further, it is equally possible to apply the present invention to the MIMO communication scheme described in Non-Patent Document 7.

(Embodiment 4)

The method of mapping data on a modulated symbol will be explained with the present embodiment, using an LDPC-CC and M-ary modulation which has 16 signal points or more such as 16 QAM and 64 QAM.

Figure 27:
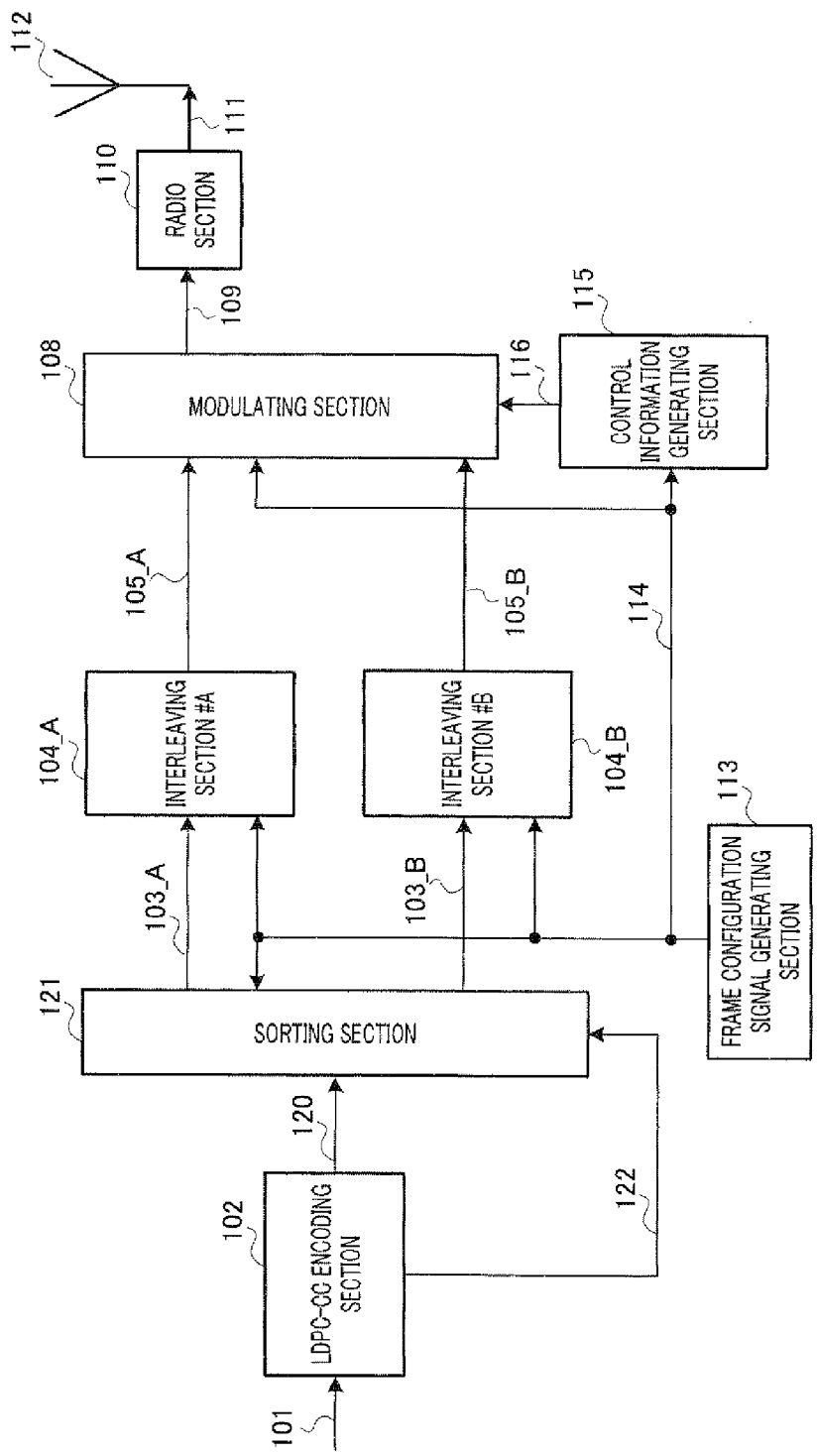
FIG. 27 is a block diagram showing a configuration example of a transmitting apparatus according to Embodiment 4.

FIG. 27, in which the same components as in FIG. 5 are assigned the same reference numerals, shows a configuration example of the transmitting apparatus according to the present embodiment. Transmitting apparatus 1500 of FIG. 27 differs from transmitting apparatus 100 of FIG. 5 in directly inputting interleaved encoded data 105_A and 105_B acquired from interleaving section #A (104_A) and interleaving section #B (104_B), in modulating section 108.

Figure 28:
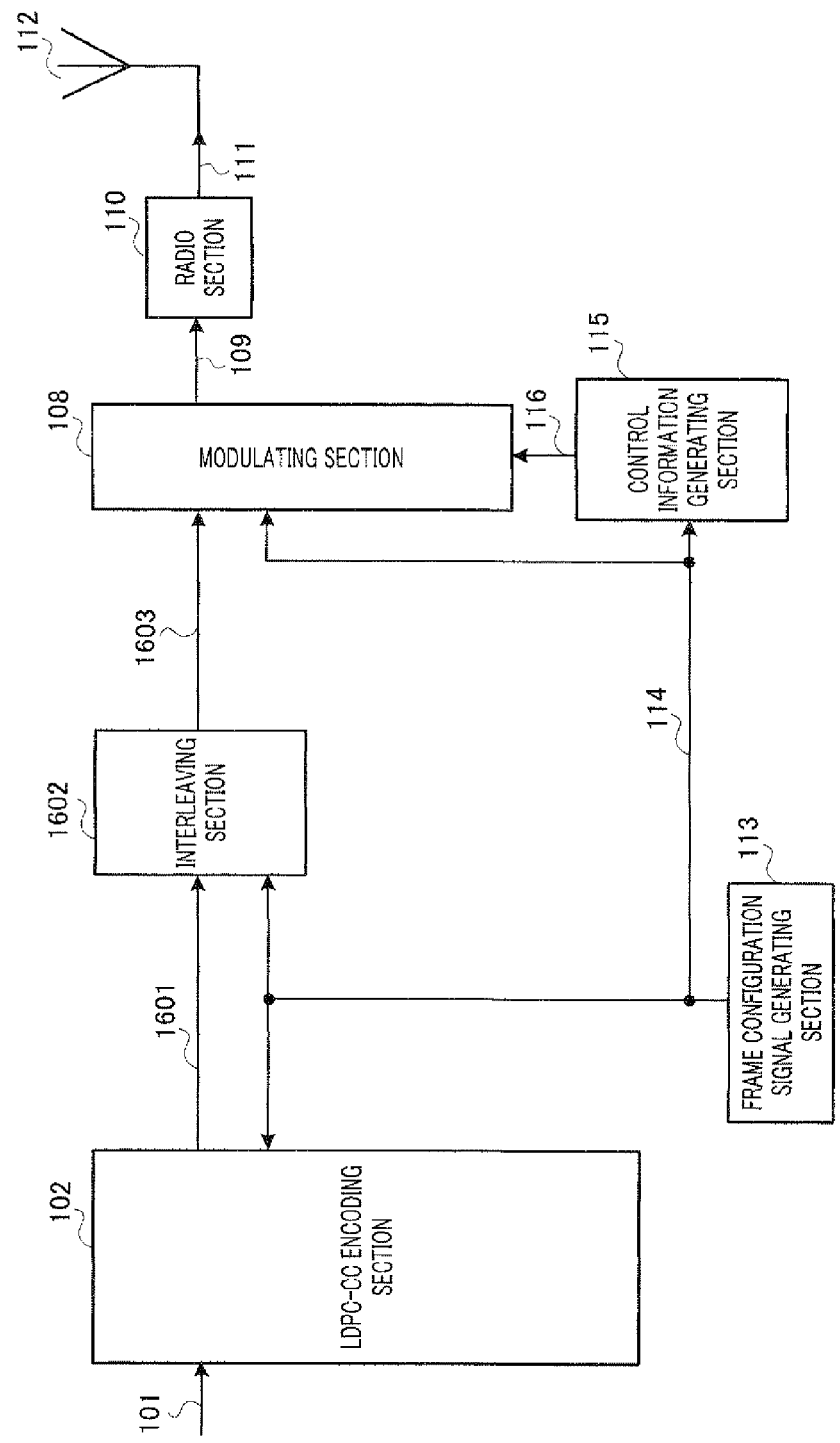
FIG. 28 is a block diagram showing a configuration example of a transmitting apparatus according to Embodiment 4.

FIG. 28 shows a configuration example of a transmitting apparatus which is different from in FIG. 27. In transmitting apparatus 1600 of FIG. 28 in which the same components as in FIG. 27 are assigned the same reference numerals, encoded data 1601 acquired from LDPC-CC encoding section 102 is outputted to interleaving section 1602, and interleaved encoded data 1603 is outputted to modulating section 108.

Figure 29:
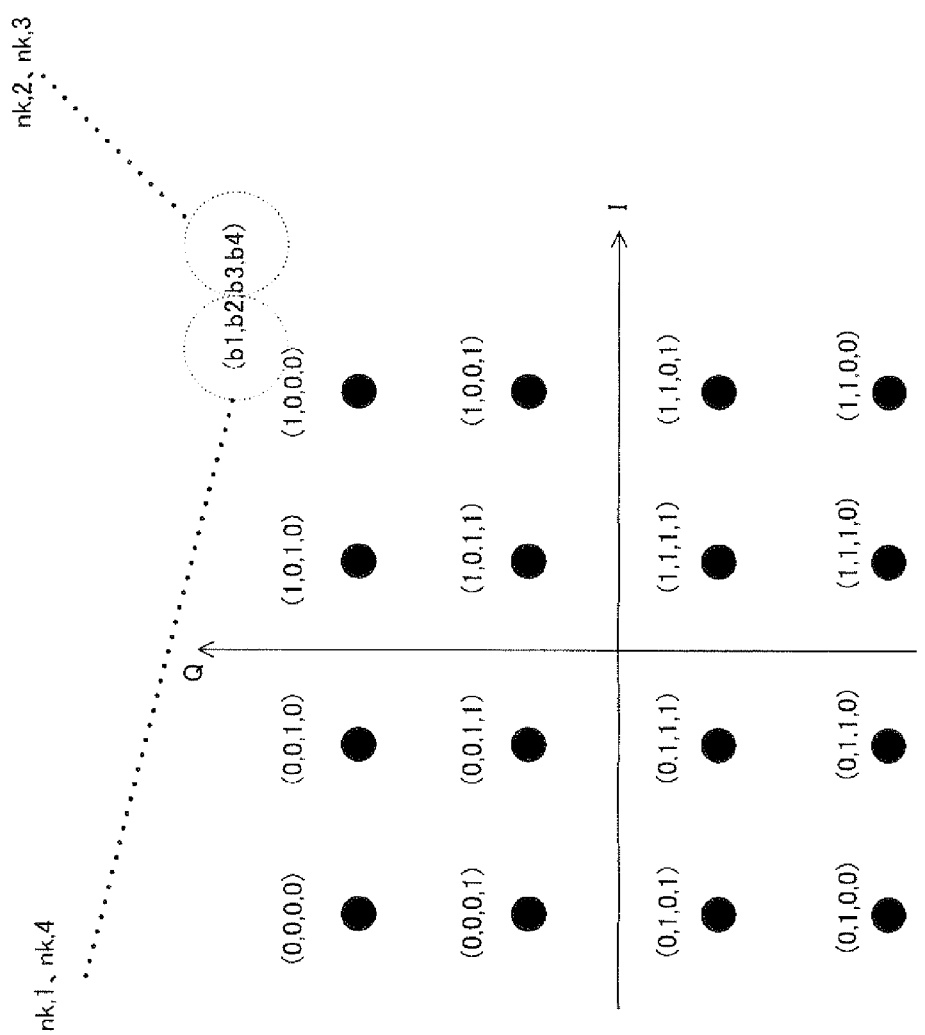
FIG. 29 shows an example of a signal point constellation in 16QAM.

Here, FIG. 29 illustrates a state of a signal point allocation (i.e. mapping) of four inputted bits, b1, b2, b3 and b4, in the in-phase I and quadrature Q plane, when the modulation scheme is 16 QAM.

By the way, as shown in Non-Patent Document 8, when the modulation scheme in modulating section 108 is 16 QAM, the possibility of error (represented by the numeric value of a log-likelihood ratio) is not uniform between b1, b2, b3 and b4 in FIG. 29. When signal point allocation is provided as shown in FIG. 29, the possibility of error is equal between b1 and b2, and the possibility of error is equal between b3 and b4.

Therefore, the present embodiment proposes the method of allocating significant bits for probability propagation (in the present embodiment, $n_{k,2}$ and $n_{k,3}$ (k=1, 2, 3, 4, 5, ... )) to one of the set of b1 and b2 and the set of b3 and b4. In FIG. 29, assume that significant bits for probability propagation are allocated to the set of b2 and b3. Therefore, other bits than significant bits for probability propagation (i.e. $n_{k,1}$ and $n_{k,4}$ (k=1, 2, 3, 4, 5, ... )) are allocated to the set of b1 and b4.

This processing will be explained using the configurations shown in FIG. 27 and FIG. 29.

In transmitting apparatus 1500 of FIG. 27, modulating section 108 receives as input interleaved encoded data #A (105_A), interleaved encoded data #B (105_B) and frame configuration signal 114.

Modulating section 108 forms baseband signal 109 by allocating interleaved encoded data #A (105_A) (corresponding to $n_{k,2}$ and $n_{k,3}$ (k=1, 2, 3, 4, 5, ... ) in the present embodiment) to the set of b3 and b4 in FIG. 29 and by allocating interleaved encoded data #B (105_B) (corresponding to $n_{k,1}$ and $n_{k,4}$ (k=1, 2, 3, 4, 5, ... ) in the present embodiment) to the set of b1 and b2 in FIG. 29.

In transmitting apparatus 1600 of FIG. 28, interleaving section 1602 performs interleaving processing of significant bits and the rest of the bits included in encoded data 1601, separately. Modulating section 108 performs the same mapping processing as in FIG. 29, on the interleaved significant bits and the rest of the interleaved bits.

By performing such allocation (mapping), the receiving apparatus can find the log-likelihood ratio and improve the error rate performance upon performing decoding based on the log-likelihood ratio.

An important point of the present embodiment is to allocate significant bits for probability propagation in an LDPC-CC (i.e. $n_{k,2}$ and $n_{k,3}$ (k=1, 2, 3, 4, 5, ... )) in a fixed manner upon allocating bits to signal points in 16 QAM. By this means, it is possible to improve error rate performance of significant bits for probability propagation, so that it is possible to efficiently improve the error rate performance of received data which is finally acquired.

Also, although an example of allocating bits to signal points in 16 QAM has been described using FIG. 29 with the present embodiment, the present invention is not limited to this. Also, although 16 QAM has been described as an example of a modulation scheme, the present invention is not limited to this, and it is equally possible to apply the present invention to 64 QAM as shown in Non-Patent Document 8. Further, the present invention is naturally applicable to 128 QAM, 256 QAM, and so on.

Also although an example case has been described above with the present embodiment where the present invention is applied to single-carrier communication, the present invention is not limited to this, and, even if the present invention is applied to multicarrier communication such as OFDM communication, it is equally possible to implement the present invention. Further, it is equally possible to apply the present invention to, for example, the spread spectrum communication scheme and the SC-FDMA communication scheme. Further, it is equally possible to apply the present invention to the MIMO communication scheme described in Non-Patent Document 7.

(Embodiment 5)

An embodiment will be explained below where the feedback control described in Embodiment 2 is applied to the OFDMA communication scheme.

Figure 30:
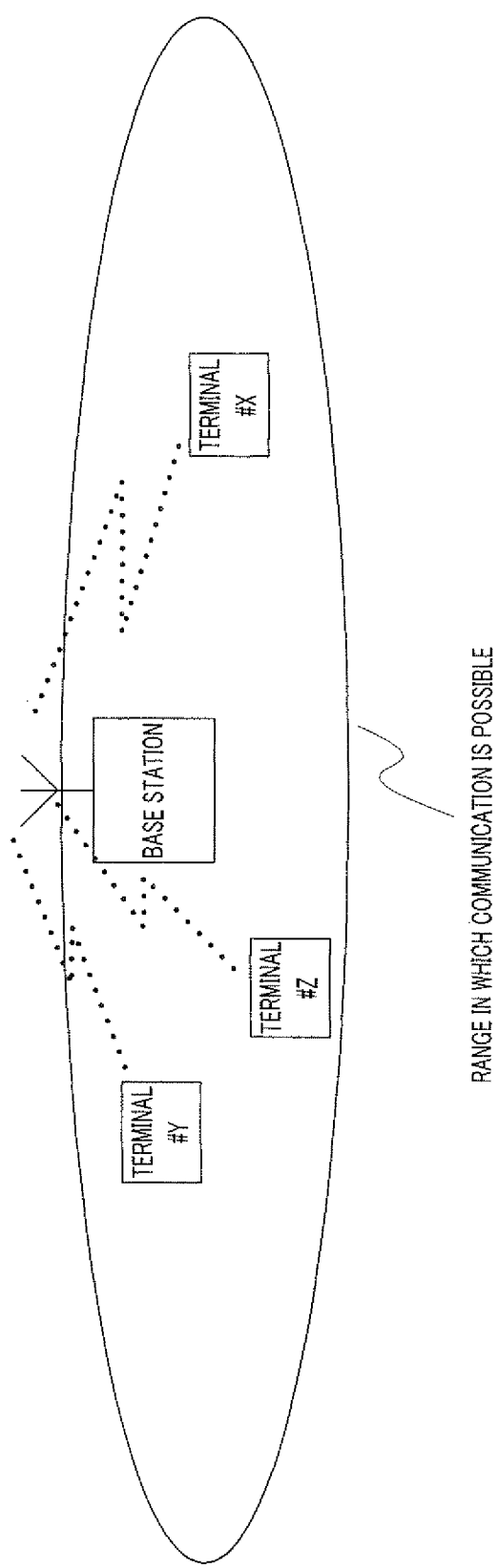
FIG. 30 illustrates Embodiment 5.

FIG. 30 shows the relationship between a base station and terminals, where there are terminal #X, terminal #Y and terminal #Z in the range in which the base station can perform communication. The terminals receive symbols for channel variation estimation transmitted from the base station, and transmit these symbols to the base station as feedback information. In the case of FIG. 30, the base station receives feedback information from terminal #X, terminal #Y and terminal #Z.

Figure 31:
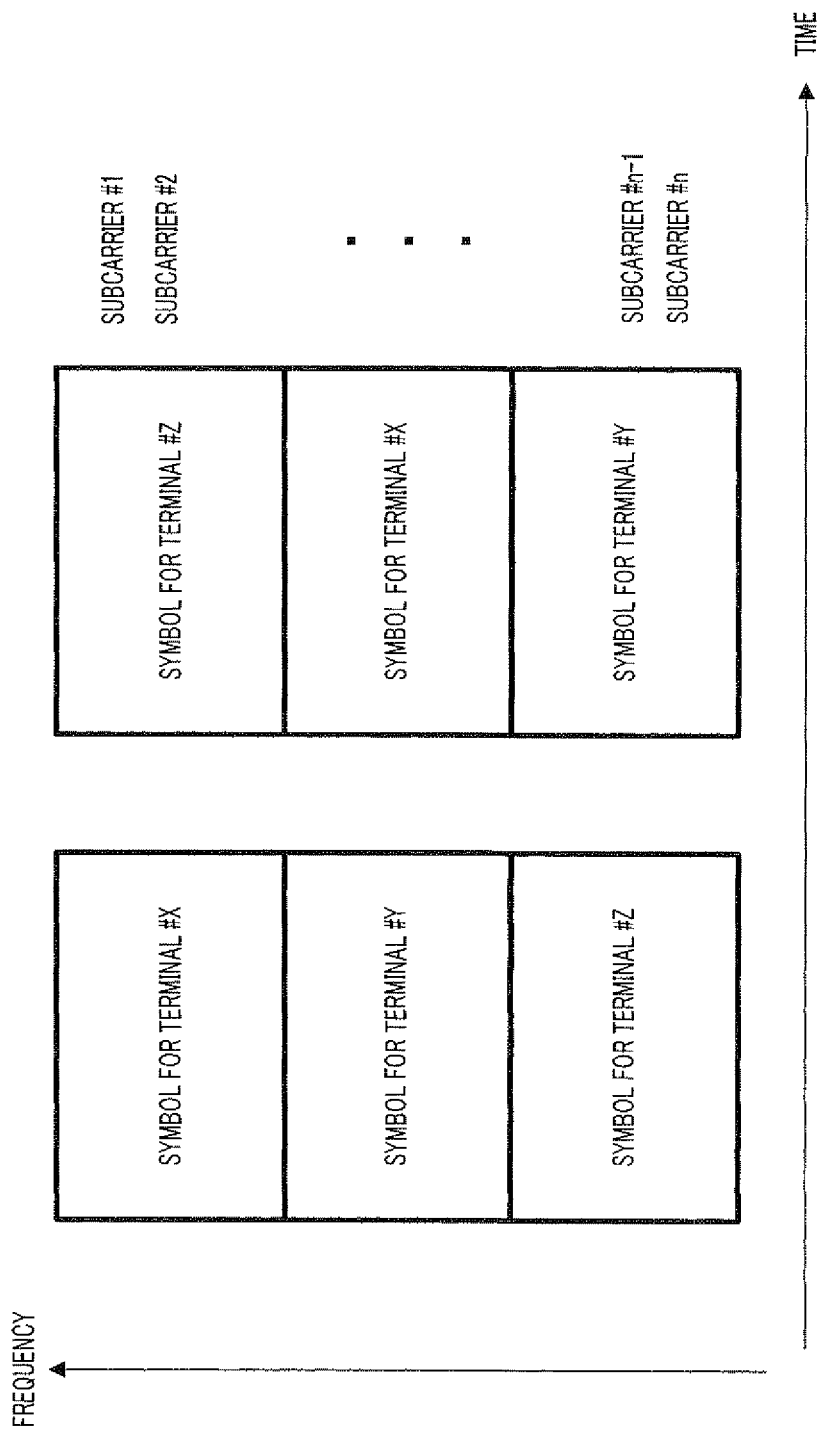
FIG. 31 shows an example of a transmission frame configuration of a base station.

FIG. 31 shows an example of the frame configuration of a modulated signal that is transmitted from the base station on the time axis and the frequency axis. Based on feedback information from the terminals, the base station allocates symbols to transmit to terminal #X, terminal #Y and terminal #Z, on the time axis and the frequency axis.

In the example shown in FIG. 31, subcarriers #1 to #n are divided into three in the frequency axis direction. In FIG. 31, symbols for terminal #X (or #Y or #Z) represent the symbols that are transmitted from the base station to terminal #X (or #Y or #Z).

In the case of OFDMA, as shown in FIG. 31, terminals to allocate to subcarriers vary according to time. In addition, as in Embodiment 2, among a plurality of symbols to transmit to, for example, terminal #X, the present embodiment determines symbols for transmitting significant bits for probability propagation, $n_{k,2}$ and $n_{k,3}$ (k=1, 2, 3, 4, 5, . . . ), in an LDPC-CC, based on feedback information from terminal #X.

Thus, even in the case of OFDMA, if the same processing as in Embodiment 2 is applied to terminals, it is possible to provide the same effect as in Embodiment 2.

Also, although the following has not been described above with the present embodiment, in the case of performing coding with puncturing, by puncturing other bits than significant bits (i.e. a first encoded data group corresponding to column numbers where there are "1's" in places outside protographs in an LDPC-CC cheek matrix), it is possible to set a larger coding rate without degrading quality.

As an applied example of this, in the case of performing, for example, hybrid ARQ, there is a method of, first, puncturing other bits than significant bits (i.e. a first encoded data group corresponding to column numbers where there are "1's" in places outside protographs in an LDPC-CC check matrix) and retransmitting the punctured bits upon retransmission.

(Embodiment 6)

The puncturing method will be explained with the present embodiment for adjusting the coding rate of an LDPC-CC having a cheek matrix where there are "1's" in elements outside protographs, as shown in FIG. 3.

Non-Patent Document 9 discloses a puncturing method whereby the transmitting apparatus periodically decide bits as puncture bits (i.e. non-transmitted bits) every predetermined interval, and transmits other bits than the puncture bits. The receiving apparatus decodes all bits including the puncture bits, using the log-likelihood ratio of the bits transmitted from the transmitting apparatus. According to the puncturing method disclosed in Non-Patent Document 2, puncture bits are periodically decided. Consequently, significant bits for probability propagation may be punctured, and, the error correcting performance after puncturing varies depending on which bits are determined as puncture bits.

Figure 32:
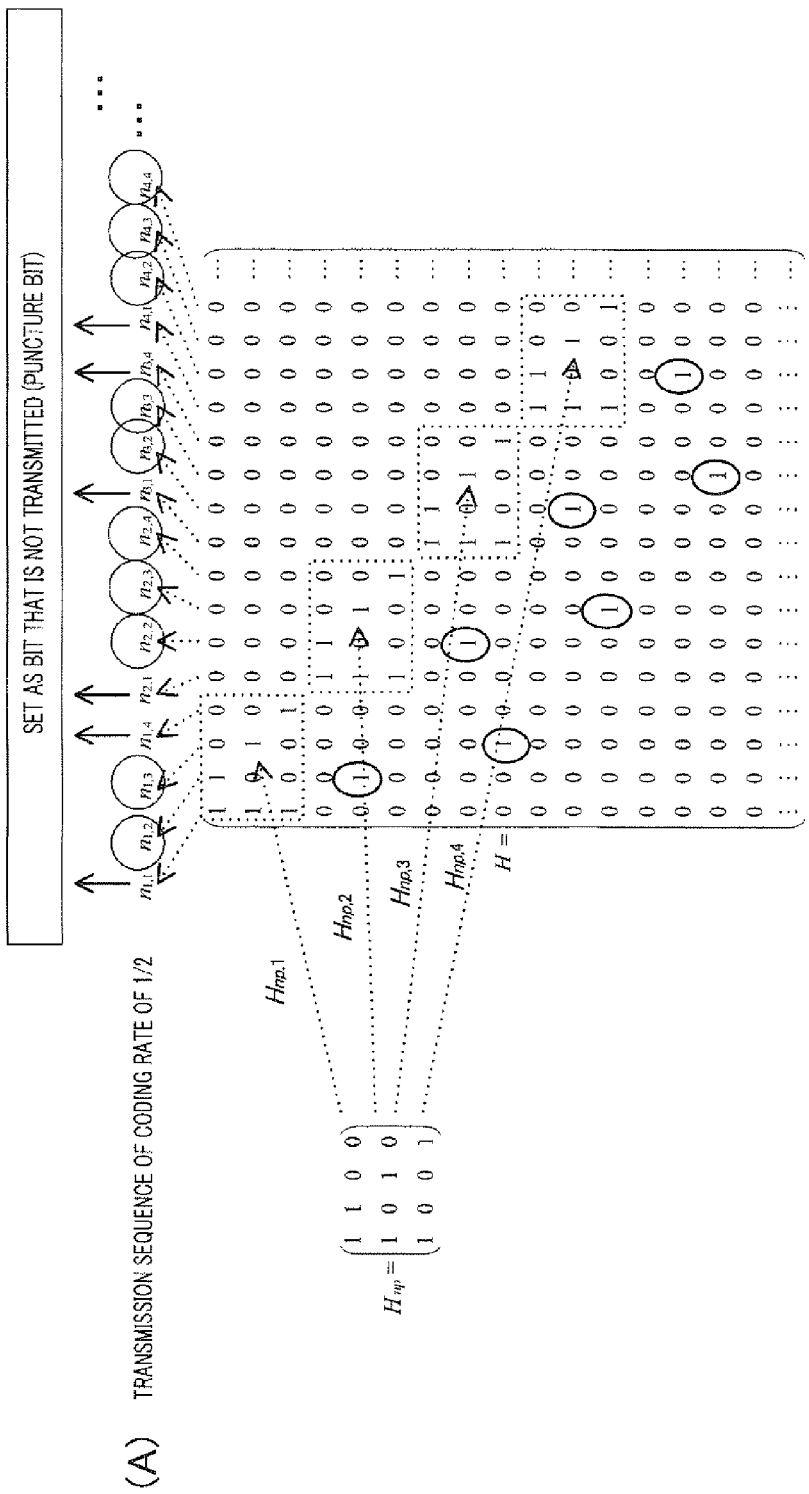
FIG. 32 illustrates a puncturing method according to Embodiment 6.

The present embodiment proposes a puncturing method based on significant bits for probability propagation and other bits than the significant bits for probability propagation. The puncturing method will be explained below in detail, using an LDPC-CC having the check matrix shown in FIG. 3 as an example. Also, FIG. 32 shows the check matrix of FIG. 3 again, and the puncturing method of the present embodiment will be explained using FIG. 32. In FIG. 32, the sequence shown in FIG. 32A is the transmission sequence of a coding rate of ½ before puncturing, and the sequence shown in FIG. 32B is the transmission sequence of a coding rate of ⅘ after puncturing.

As described in Embodiment 1, in the check matrix in FIG. 32, $n_{k,2}$ and $n_{k,3}$ (k=1, 2, 3, 4, 5, . . . ) where there are "1's" in places outside protographs, are significant bits for probability propagation.

According to the puncturing method proposed in the present embodiment, the number of puncture bits (non-transmitted bits) per unit (e.g. puncture period) selected from significant bits for probability propagation, $n_{k,2}$ and $n_{k,3}$, is set smaller than the number of puncture bits (non-transmitted bits) per unit selected from bits, $n_{k,1}$ and $n_{k,4}$, other than significant bits for probability propagation, $n_{k,2}$ and $n_{k,3}$.

For example, as shown in FIG. 32, the number of puncture bits per unit (16 bits) selected from significant bits for probability propagation, $n_{k,2}$ and $n_{k,3}$, is 0, and the number of puncture bits per unit (16 bits) selected from bits, $n_{k,1}$ and $n_{k,4}$, other than the significant bits for probability propagation, $n_{k,2}$ and $n_{k,3}$, is six.

As shown in FIG. 32B, the transmission sequence of a coding rate of ⅘ after puncturing is represented by $n_{1,2}, n_{1,3}, n_{2,2}, n_{2,3}, n_{2,2}, n_{2,3}, n_{2,4}, \ldots, n_{2k+1,2}, n_{2k+1,3}, n_{2k+2,2}, n_{2k+2,3}, n_{2k+2,4}$, and so on.

Also, a case has been described above with the example shown in FIG. 32, where significant bits for probability propagation, $n_{k,2}$ and $n_{k,3}$, are not selected as puncture bits (non-transmitted bits) and are always transmitted. However, it is not that significant bits for probability propagation, $n_{k,2}$ and $n_{k,3}$, should not be selected as puncture bits (non-transmitted bits) (in the case where the coding rate to be provided by puncturing is high, a case may occur where significant bits for probability propagation, $n_{k,2}$ and $n_{k,3}$, have to be selected as puncture bits (non-transmitted bits)).

As described above, the number of puncture bits (non-transmitted bits) per unit (e.g. puncture period) selected from significant bits for probability propagation, $n_{k,2}$ and $n_{k,3}$, is set smaller than the number of puncture bits (non-transmitted bits) per unit selected from bits, $n_{k,2}$ and $n_{k,4}$, other than the significant bits for probability propagation, $n_{k,2}$ and $n_{k,3}$, so that it is possible to provide the same effect as above.

Also, in the case of preferentially selecting other bits than significant bits for probability propagation as puncture bits and not puncturing the significant bits for probability propagation as much as possible, it is possible to suppress the degradation of received quality (i.e. degradation of error correcting performance) more reliably upon adopting puncturing. This is because, when more significant bits for probability propagation are punctured, degradation of received quality is more likely to be caused, and, when fewer significant bits for probability propagation are punctured, degradation of received quality is less likely to be caused.

Thus, according to the present embodiment, the number of puncture bits (non-transmitted bits) per unit (e.g. puncture period) selected from significant bits for probability propagation, $n_{k,2}$ and $n_{k,3}$, is set smaller than the number of puncture bits (non-transmitted bits) per unit selected from bits, $n_{k,1}$ and $n_{k,4}$, other than the significant bits for probability propagation, $n_{k,2}$ and $n_{k,3}$.

Figure 33:
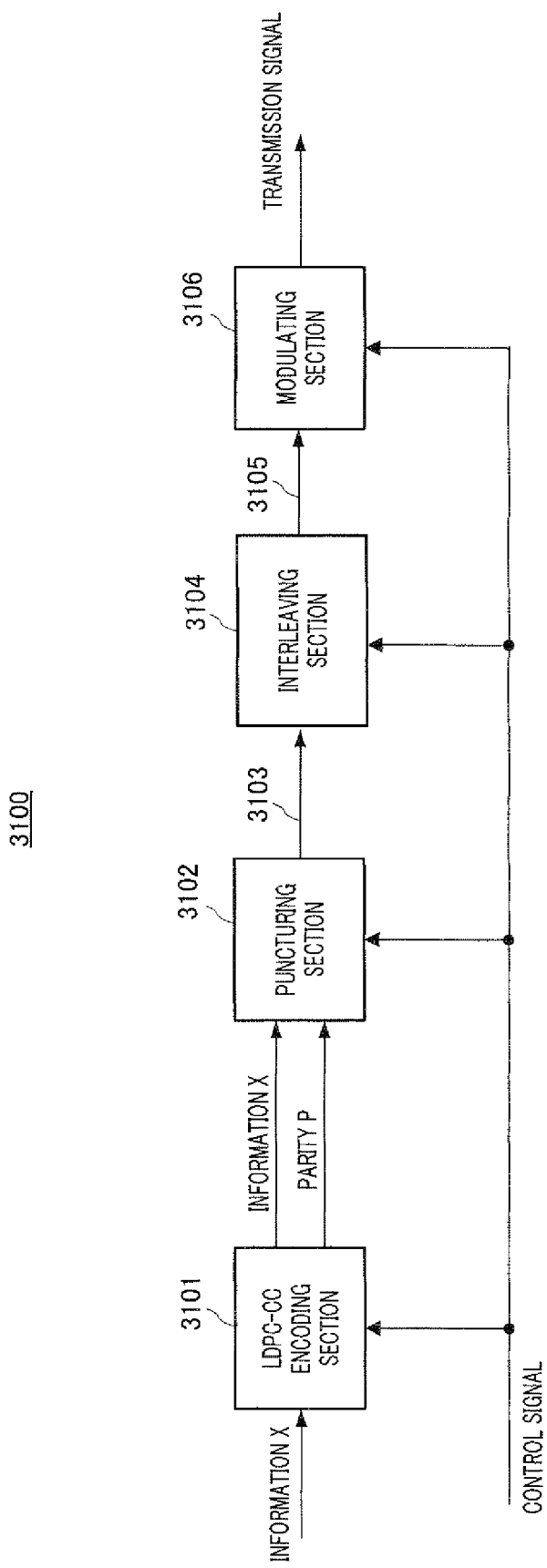
FIG. 33 is a block diagram showing a configuration example of a transmitting section according to Embodiment 6.

FIG. 33 shows an example of the configuration of the transmitting section according to the present embodiment. Transmitting section 3100 shown in FIG. 33 is provided with LDPC-CC encoding section 3101, puncturing section 3102, interleaving section 3104 and modulating section 3106.

LDPC-CC encoding section 3101 receives as input information X and a control signal, and generates information X and parity P based on this control signal. LDPC-CC encoding section 3101 outputs generated information X and parity P to puncturing section 3102.

Puncturing section 3102 receives as input information X and a control signal, and performs puncturing according to the above rule. That is, puncturing section 3102 determines puncture bits such that the number of puncture bits (non-transmitted bits) per unit (e.g. puncture period) selected from significant bits for probability propagation, $n_{k,2}$ and $n_{k,3}$, is set smaller than the number of puncture bits (non-transmitted bits) per unit selected from bits, $n_{k,1}$ and $n_{k,4}$, other than the significant bits for probability propagation, $n_{k,2}$ and $n_{k,3}$, and puncturing section 3102 performs puncturing. Here, the coding rate is set, that is, the puncturing method is determined based on, for example, the channel state and the packet loss occurrence condition which are acquired from the communicating party, so that a control signal may be generated, or the transmitting apparatus may set the coding rate, that is, determine the puncturing method to generate a control signal. Puncturing section 3102 outputs punctured data 3103 to interleaving section 3104.

Interleaving section 3104 receives as input punctured data 3103 and a control signal, and interleaves punctured data 3103 based on this control signal. Interleaving section 3104 outputs interleaved data 3105 to modulating section 3106.

Modulating section 3106 receives as input interleaved data 3105 and a control signal, generates a transmission signal by performing processing such as mapping, quadrature modulation and frequency conversion on interleaved data 3105 base on this control signal, and outputs this transmission signal.

The receiving apparatus performs, for example, BP (Belief Propagation) decoding, sum-product decoding, shuffled BP decoding, normalized BP decoding and offset BP decoding. By this means, even when the transmitting side performs puncturing, it is possible to decode data. Here, the receiving apparatus needs to assign zero to puncture bits as the log-likelihood ratio.

As described above, according to the present embodiment, the number of puncture bits (non-transmitted bits) per unit (e.g. puncture period) selected from significant bits for probability propagation, is set smaller than the number of puncture bits (non-transmitted bits) per unit selected from other bits than the significant bits for probability propagation. By this means, it is possible to suppress the degradation of received quality (i.e. degradation of error correcting performance) upon puncturing.

The present invention is not limited to all the above embodiments, and can be implemented with various changes. For example, although cases have been described above with embodiments where the present invention is realized using, mainly, an encoder and transmitting apparatus, the present invention is not limited to this, and it is equally possible to apply the present invention even when the present invention is realized using a power line communication apparatus.

Also, it is equally possible to use this coding method and transmitting method as software. For example, it is possible to store program that performs the above coding method and transmitting method in a ROM (Read Only Memory) and operate this program by a CPU (Central Processor Unit).

Also, it is equally possible to store program that operates the above coding method and transmitting method in a computer-readable storage medium, record the program stored in the storage medium in a RAM (Random Access Memory), and operate the computer according to the program.

Also, it is not needless to say that the present invention is useful in not only wireless communication but also visible light communication and light communication.

The disclosures of Japanese Patent Application No. 2007-184540, filed on Jul. 13, 2007, and Japanese Patent Application No. 2008-181616, filed on Jul. 11, 2008, including the specifications, drawings and abstracts, are incorporated herein by reference in their entireties.

Indusdrial Applicability

The present invention is widely applicable to wireless systems using an LDPC-CC, and it is suitable when the present invention is applied to, for example, the OFDM-MIMO communication system. Also, the present invention is widely applicable to not only wireless communication systems but also communication systems using an LDPC-CC (e.g. power line communication system).

The invention claimed is:

1. A transmitting apparatus comprising:
   an encoding section configured to encode a low-density parity-check convolutional code to form an encoded data;
   a sorting section configured to sort the encoded data acquired in the encoding section, into a first encoded data group corresponding to column numbers where there are "1's" in places outside protographs in a low-density parity-check convolutional code check matrix, and a second encoded data group corresponding to column numbers where there are non "1's" in places outside protographs in a low-density parity-check convolutional code check matrix; and
   a radio section configured to transmit a transmission signal in which the first encoded data group and the second encoded data group are allocated to different times or a transmission signal in which the first encoded data group and the second encoded data group are allocated to different frequencies.

2. The transmitting apparatus according to claim 1, further comprising;
   a first interleaver that interleaves the first encoded data group; and
   a second interleaver that interleaves the second encoded data group,
   wherein the radio section transmits a transmission signal in which the first encoded data group interleaved in the first interleaver and the second encoded data group interleaved in the second interleaver are allocated to different times or a transmission signal in which the first encoded data group and the second encoded data group are allocated to different frequencies.

3. The transmitting apparatus according to claim 1, wherein the radio section transmits a transmission signal in which the first encoded data group is allocated to a frequency determined based on feedback information from a communicating party.

4. The transmitting apparatus according to claim 1, wherein when a retransmission request is received, the radio section retransmits the first encoded data group using a frequency having a better frequency characteristic than the second encoded data group.

5. The transmitting apparatus according to claim 1, further comprising an M-ary modulation section that allocates the first encoded data group to fixed bits among a plurality of bits forming a symbol, and performs M-ary modulation.

6. A transmitting method comprising:
   encoding a low-density parity-check convolutional code to form an encoded data;
   sorting the encoded data into a first encoded data group corresponding to column numbers where there are "1's" in places outside protographs in a low-density parity-check convolutional code cheek matrix, and a second encoded data group corresponding to column numbers where there are non "1's" in places outside protographs in a low-density parity-check convolutional code check matrix; and
   transmitting a transmission signal in which the first encoded data group and the second encoded data group are allocated to different times or a transmission signal in which the first encoded data group and the second encoded data group are allocated to different frequencies.

7. A transmitting method comprising:

encoding a low-density parity-check convolutional code to form an encoded data;

sorting the encoded data into a first encoded data group corresponding to column numbers where there are "1's" in places outside protographs in a low-density parity-check convolutional code check matrix, and a second encoded data group corresponding to column numbers where there are non "1's" in places outside protographs in a low-density parity-check convolutional code check matrix; and retransmitting the first encoded data group using a frequency having a better frequency characteristic than the second encoded data group.

* * * * *